(12) United States Patent
Hauck et al.

(10) Patent No.: US 6,238,831 B1
(45) Date of Patent: May 29, 2001

(54) OFFSET PRINTING PLATES HAVING HIGH PRINT RUN STABILITY

(75) Inventors: Gerhard Hauck, Badenhausen; Mathias Jarek, Northeim, both of (DE); Jerome Kesselman, Yorktown Heights, NY (US); Socrates Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/493,837

(22) Filed: Jan. 28, 2000

Related U.S. Application Data

(63) Continuation of application No. PCT/DE99/01673, filed on Jun. 7, 1999.

(30) Foreign Application Priority Data

Jun. 5, 1998 (DE) .............................................. 198 25 244

(51) Int. Cl.[7] ............................. G03G 13/26; G03F 7/021
(52) U.S. Cl. .............................................. 430/49; 430/302
(58) Field of Search ....................................... 430/133, 134, 430/280.1, 281.1, 159, 160, 49, 302

(56) References Cited

U.S. PATENT DOCUMENTS

| 4,102,686 | 7/1978 | Weinberger et al. | 96/91 R |
| 4,902,726 | 2/1990 | Hayashi et al. | 522/18 |
| 5,700,619 | 12/1997 | Baumann et al. | 430/175 |
| 6,060,217 | * 5/2000 | Nguyen et al. | 430/302 |

FOREIGN PATENT DOCUMENTS

| 9524851 | 1/1997 | (DE) . |
| 0766140 | 4/1997 | (EP) . |
| 541138 | 8/1977 | (RU) . |
| WO9911458 | 3/1999 | (WO) . |

* cited by examiner

*Primary Examiner*—John Goodrow
(74) *Attorney, Agent, or Firm*—Baker Botts L.L.P.

(57) ABSTRACT

The invention relates to coating solutions, processes for the preparation of a printing plate using these coating solutions as well as printing plates prepared in this manner; in particular, the invention relates to printing plates the photosensitive layer of which contains homogeneously distributed polymer particles.

9 Claims, 36 Drawing Sheets

OFFSET PRINTING PLATES HAVING HIGH PRINT RUN STABILITY

This is a continuation of copending international application No. PCT/DE99/01673 filed Jun. 7, 1999.

The invention relates to photosensitive coating compositions, processes for the preparation of a printing plate using these coating compositions, and printing plates prepared in this way. In particular, the invention relates to printing plates with high print run stability, the photosensitive layer of which contains homogeneously distributed polymer particles.

In recent times, the requirements with regard to the print run stability of offset printing plates have increased. For the improvement of the mechanical properties of offset plates, basically two methods have been discussed.

One of them relates to the improvement of the properties of the binders or the photosensitive composition (U.S. Pat. No. 4,102,686). This method often entails high costs due to the complexity of the synthesis regarding the preparation of such custom high-performance binders.

The other, less expensive method is the introduction of polymer particles into the photosensitive layer. The mechanical resistance of such particle-containing layers is often superior to that of layers with modified binders. Apart from the increase of the mechanical resistance of the layer, there are further advantages: From the literature it is known that the chemical resistance can be increased while the exhausting times in the copying frame and the adhesiveness can be reduced. So far, various methods have been employed for introducing the polymer particles into the layer.

Commercially available micronized particles which are difficult to dissolve in common organic solvents (for example polyethylene, polytetrafluoroethylene, cross-linked polymethylmethacrylate or polyamide) are dispersed and added to the coating solution. This entails the disadvantage that these polymer particles first have to be dispersed which constitutes an additional process step. In some areas, the particles are often distributed rather inhomogeneously after the coating has been completed. Furthermore, in particles consisting of nonpolar polymers the adhesion to the layer is reduced. The retention time of the coating solution prepared is limited as well since these dispersions tend to form sediments or agglomerates. Furthermore, the particle dispersions cause problems in the filtering of the coating solution since the pore size of the filter cannot be smaller than the particle diameter. Starting solutions which have not been sufficiently filtered often lead to coating defects.

Another method is to prepare dispersions or emulsions of polymers by emulsion/dispersion polymerization, for example in copolymers of acrylates, styrene derivatives and other monomers, or by precipitation reaction of polymers which dissolve in common organic solvents, for example acrylonitrile butadiene styrenes (ABS) which are then added to the coating solution (U.S. Pat. No. 4,233,390, EP-A-0 709 399, U.S. Pat. No. 5,616,449, EP-A-0 632 328, EP-B-0 509 523).

Thus, due to the higher polarity of the polymer particles, an improved adhesion of the particles to the layer is achieved, but the above-mentioned disadvantages such as poor filterability, locally inhomogeneous distribution in the layer, and short stability of the batch remain.

Another process describes, with regard to positive working printing plates, the use of specifically developed polymers which are soluble in alkaline developers and organic media and which form a homogenous solution with the coating composition. By way of complicated drying apparatuses difficult to operate with regard to the process control, a separation of the binders intended for the positive plates and the polymers during drying is achieved (EP-A-0 766 140). This coating solution can be filtered since a "real" solution is present. A disadvantage of this method is that the particles are preferably formed in the upper part of the photosensitive layer, with the lower part of the layer not being protected from mechanical abrasion. Furthermore, both the drying apparatus and the polymers which form the particles, have to be specifically adapted to this purpose of use, which constitutes a high cost factor. A further disadvantage of this method is that the resulting polymer particles, which are soluble in the developer, can partly be extracted from the layer by the developing step and that the remaining cavities rather destabilize the image areas.

In spite of the intensive research in the field of offset printing plates with high print run stability, the present solution approaches still call for improvements, particularly with respect to easier producibility and less expensive materials.

Therefore, it is the object of the invention to provide coating solutions which provide printing plates, particularly offset printing plates, with high print run stability without having to accept the above-mentioned disadvantages. Additionally, the printing plate is supposed to be developable by means of conventional developers and has to exhibit high resolutions. Furthermore, the ink acceptance of the printing plate is supposed to be fast and good. Moreover, a sufficient resistance to the common purification chemicals such as benzine-based rubber blanket detergents, plate detergents etc. should be provided.

This object is solved by a coating solution, comprising a) a positive or negative working, or electrophotographically working photosensitive composition, b) a thermoplastic polymer which is soluble in organic media but insoluble in alkaline media, c) a solvent component A which dissolves both the photosensitive composition and the thermoplastic polymer, and optionally d) a solvent component B which dissolves the photosensitive composition but not the thermoplastic polymer and which is less volatile than component A, with a) and b) being homogeneously dissolved in the mixture of c) and d).

Figure 1:
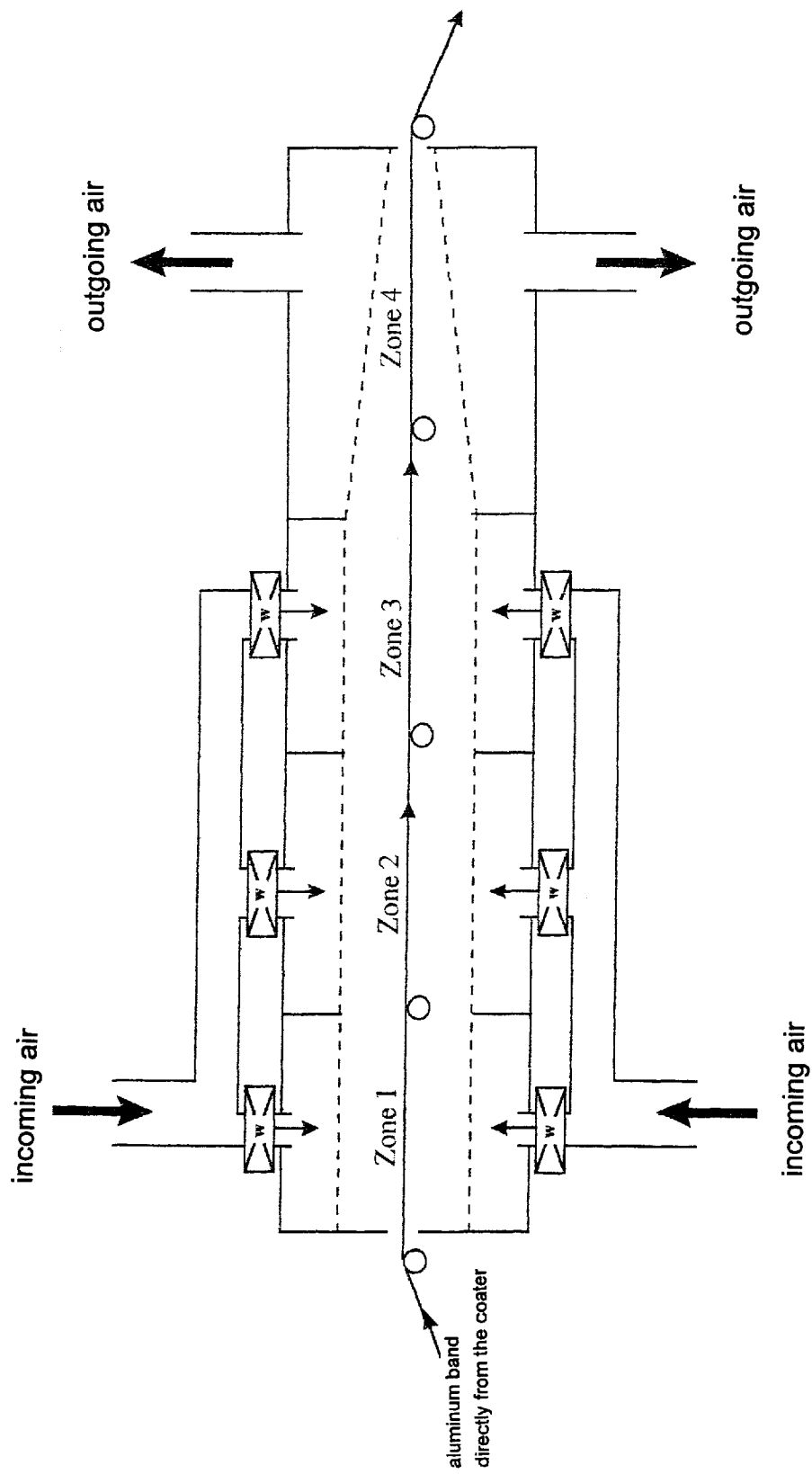
FIG. 1 shows the schematic structure of a simple commercial drier.

Apart from an optional positive or negative working photosensitive or electrophotographic composition, the printing plates according to the invention contain 1–75%, preferably 5–75%, more preferably 10–75% of a thermoplastic polymer soluble in organic media and insoluble in alkaline media which preferably is commercially available. Polymers exhibiting high abrasion stability and high tenacity values are preferred. Suitable polymers are i.a.: polystyrene (PS), styrene-acrylonitrile-copolymers (SAN), styrene-acrylonitrile-butadiene-terpolymer (ABS), acrylonitrile terpolymer, chlorinated polyethylene and styrene (ACS), acrylate-acrylonitrile-styrene-copolymers (ASA), styrene-butadiene-styrene-block-polymers (thermoplastic elastomer), styrene-isoprene-styrene-blockpolymers (thermoplastic elastomer), styrene-ethylene/butylene-styrene-blockpolymers (thermoplastic elastomer), styrene-ethylene/propylene-styrene-blockpolymers (thermoplastic elastomer), styrene maleic acid anhydride copolymers, polymethylmethacrylate (PMMA), polyalkyl(meth)acrylates, polyaryl(meth)acrylates, polyaralkyl(meth)acrylates, polycarbonates (PC), polysulfones, polyethersulfones, polyesters (soluble types), polyamides (soluble types), polyimides (soluble types), cellulose alkylester, cellulose arylester, cellulose aralkylester, polyacetale, ethylene-alkyl(meth)acrylate copolymers, polybutadiene, polyisoprene, polymethylpentene, polyvinylchloride (PVC), polyvinylcarbazole, polyvinylacetates (PVAc), ethylene-vinylacetate-copolmer (EVA), polyvinylidenechloride (PVDC), polyvinylidenefluoride (PVDF), polyurethanes (soluble types), polyalkylsiloxanes, polyarylsiloxanes, polyaralkylsiloxanes, and further types, as well as blends of the above-mentioned polymers among each other as well as copolymers of the monomers of said polymers. Particularly preferred are PS, SAN, PC, PMMA, ABS and polysulfone.

These polymers are not added to the photosensitive composition as particles but are dissolved together with said composition in organic solvents so that a homogeneous phase forms. A carrier such as for example an electrolytically grained and anodized alumina base, is coated with this solution. Only when the thin film of this solution is subsequently dried, the polymer starts to separate from the rest of the photosensitive composition towards the end of the drying phase. In order for this "in-situ" particle separation to function accurately also in commercial, simply structured driers such as for example in FIG. 1, a special solvent system comprising at least two solvents has to be used.

The coating composition used for the preparation of the printing plates according to the invention comprises the components of a photosensitive or electrophotographic composition (in the following summarized briefly as C), an easily volatile solvent component A, which dissolves both the components of the photosensitive composition as well as the particle-forming polymer P and a further solvent component B which preferably is less volatile than A and dissolves only the components of the photosensitive composition C wherein, however, the polymer P is hardly soluble.

As photosensitive composition C, positive or negative working photosensitive systems as well as electrophotographically working systems can be used as are described in U.S. Pat. No. 5,731,127, U.S. Pat. No. 3,635,709, U.S. Pat. No. 4,350,753 (positive working systems), DE-A-19518118, DE-A-4418645, EP-A-752430 (negative working systems), WO-A-97/39894, WO-A-96/20429 (thermally working systems), DE-A-19510526, EP-A-733955 (electrophotographically working systems); the present invention can be applied to this without any restrictions.

As component A, the following substances can be used for example: acetone, butanone-2 (MEK), methylisobutylketone (MIBK), cyclohexanone, tetrahydrofurane (THF), dioxan, dioxolane, isobutylformate, ethylacetate, butylacetate, methyllactate, ethyllactate, ethylether, nitroethane, methylenechloride, dichloroethylene, chloroform, trichloroethane, perchloroethylene, mixtures thereof and other highly volatile solvents common in the coating technology.

As component B, the following substances can be used for example: methanol, ethanol, butanol, ethyleneglycol, methyidiglycol, ethylglycol (EC), methylglycol (MC), dimethylformamide, dimethylacetamide, N-methylpyrrolidone, dimethylsulfoxide (DMSO), methyllactate, ethyllactate, γ-butyrolactone, mixtures thereof and other solvents common in coating technology wherein the polymer is poorly soluble.

Optionally, the coating solution according to the invention can also contain a tenside T in order to support the particle formation and to prevent a potential agglomeration of the particles. As tenside T, a broad spectrum of non-ionic or ionic compounds can be used, for example alkoxylated fatty alcohols (Brij 78™), alkoxylated silicones (for example Edaplan™), fluorinated tensides (for example FC 470™) and further substances that are compatible with the respective solvent system.

Figure 2:
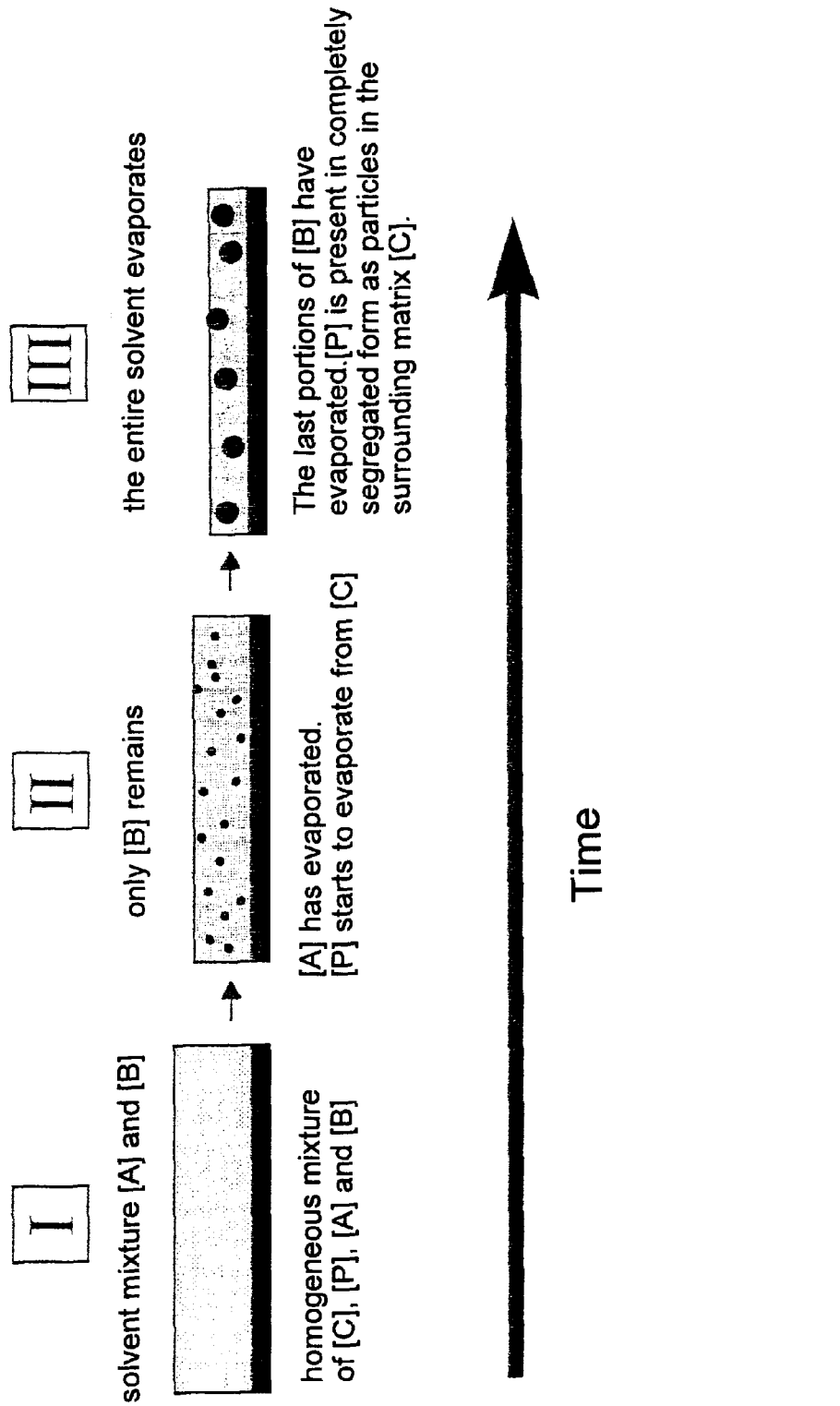
FIG. 2 illustrates the mechanism of the particle formation.

The mechanism of the particle formation is shown in FIG. 2. At the starting point (I) of the illustration, both the polymer P and the photosensitive composition C are homogeneously dissolved in the solvent mixture of A and B. In time, more and more of the highly volatile solvent component A evaporates so that the poorly soluble component B accumulates. In this phase (II), which is still sufficiently mobile, the polymer P starts to form small particles due to the incompatibility with solvent B. The particles continue to grow by coalescence until the system loses so much mobility by the continuous evaporation of the solvent B that no coalescence can occur anymore. The system now consists of two phases (III): a matrix rich in C and particles rich in P.

In some cases, only one solvent component can be used if the chemical incompatibility between the photosensitive composition C and the polymer P is sufficiently high and the system is provided with sufficient time for drying—and therefore for the particle formation. This was particularly observed in negative working systems which contained high-molecular modified polyvinyl alcohols as binders and which were dried slowly.

Several factors influence the factor which ultimately is most important in the particle formation process, i.e. the particle size. On the one hand, the process is time-dependent since the particles grow by coalescence; the faster the drying process the sooner the growth process is stopped and the smaller are the particles obtained. Thus, the time until the end of the growth step can be influenced by the performance of the drier. In commercial driers, however, the respective range is limited and furthermore requires longer retrofitting and waiting times only upon a temperature change.

Another possible parameter by which the particle size can be varied is the total solids concentration. The higher the solids concentration, the smaller are the particles that form since this corresponds to a pre-dried system. However, the variation is only slight since considerable changes in the viscosity changes of the coating solution occur and the "viscosity window" of most coaters does not leave too much scope; in most coater systems, the scope is at a maximum of ±10% in the solids content of the coating solution. Depending on the coating system, the solids concentration (in % by weight, based on the coating solution) of the coating solutions according to the invention, is 0.5–50%, preferably 1–30%, particularly preferred 5–15%.

The solvent ratio A/B turned out to be a particularly fast and easily modifiable parameter. Of all parameters, it has the greatest influence on the particle size. By modifying the solvent components and the solvent ratio, the particle size can be controlled within a broad range (for example from 1–10 μm). The more low-volatility component B is added with all other parameters being constant, the larger the particles get. The proportion (in % by weight, based on the solvent mixture of A and B) of low-volatility component B in the present invention is 0–95%, preferably 1–75%, particularly preferred 1.5–60%; the statement 0% relates to systems wherein the chemical incompatibility between the photosensitive composition C and the polymer P is sufficiently high in order to allow a particle formation during drying. The mechanical resistance increases as the particle size grows. From a certain limiting value of B in the batch, an optimum is achieved and the mechanical stability is not further improved even upon adding more B—which corresponds to a further enlargement of the particle size.

Figure 3:
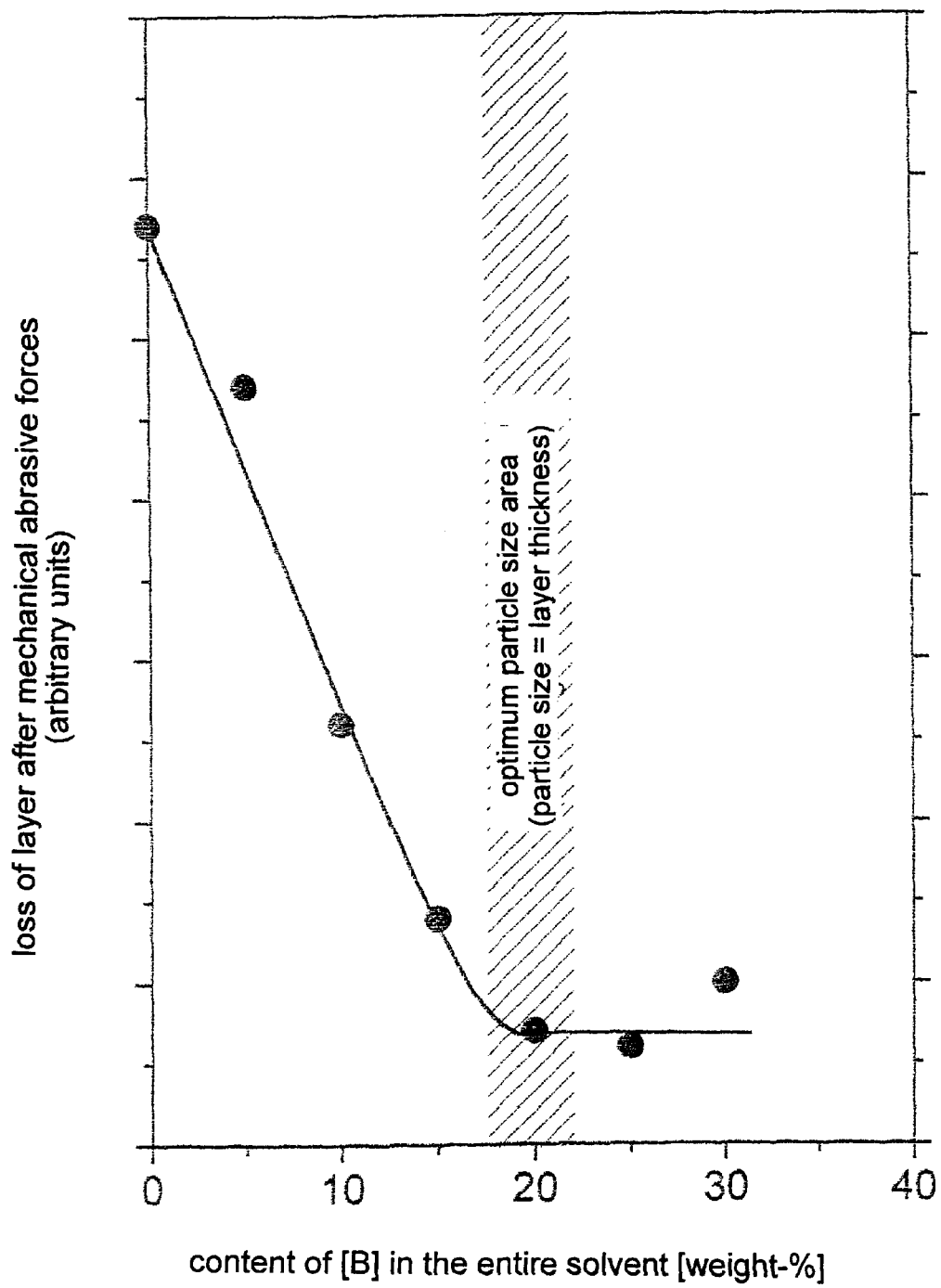
FIG. 3 shows the dependence of the mechanical stability on the solvent composition.

The average particle sizes, which in the present invention result in a considerable increase of the mechanical resistance, are within the range of 0.25–15 μm, preferably 0.5–12.5 μm, particularly preferred 0.5–10 μm. A value which is about as high as the layer thickness has turned out as optimum. This is particularly clear in FIG. 3.

If the particles are smaller than the layer thickness, they may sink further down in the layer during the drying process, so that the upper part of the layer would not protected against abrasion. Particles which are considerably higher than the layer thickness, i.e. the particles "growing out" of the layer, have not been observed yet; instead, the particles take on an elliptic shape.

Figure 4:
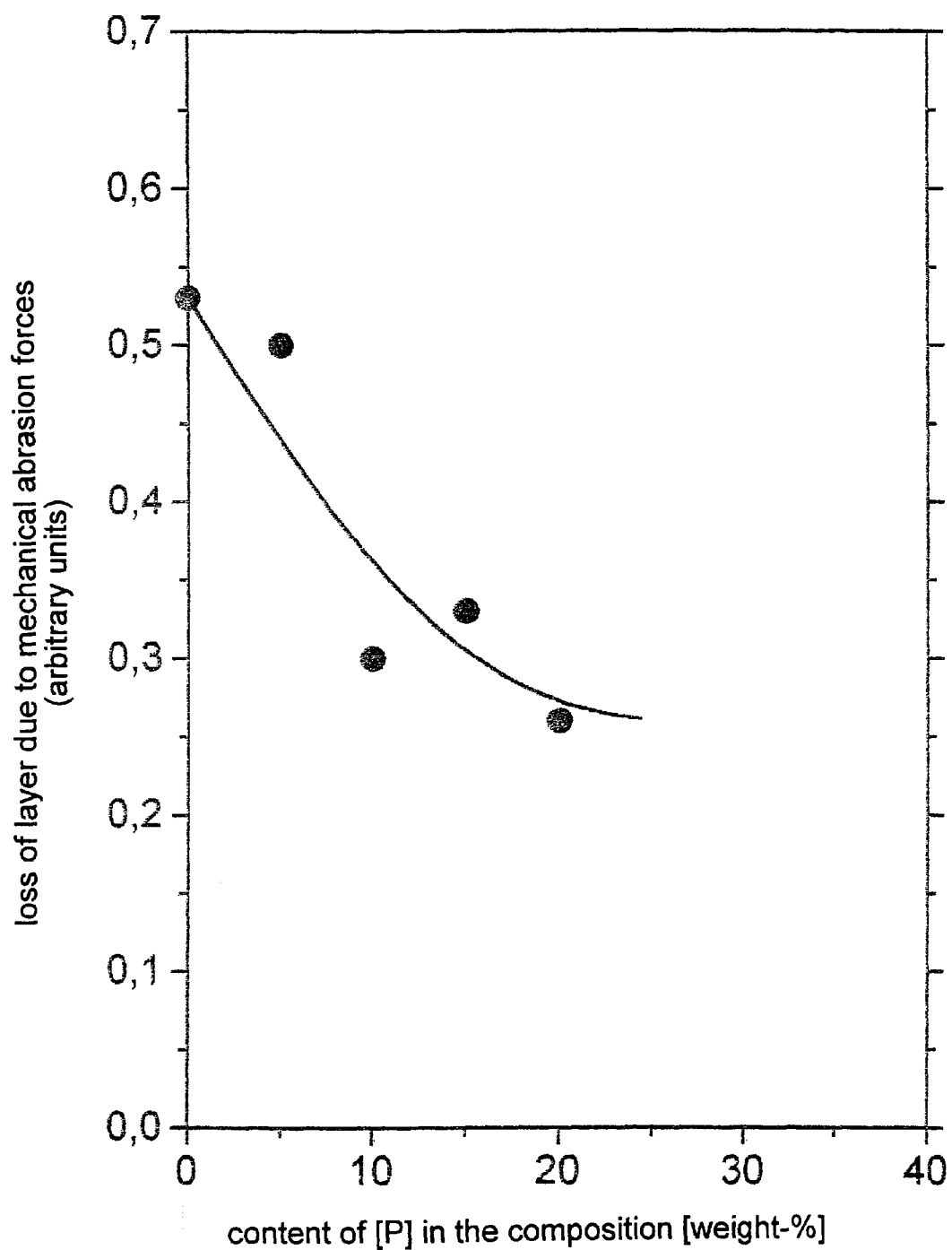
FIG. 4 shows the dependence of the mechanical stability on the amount of particle-forming polymer in the composition employed.

The number of particles and thus also the mechanical stability increases as the amount of P in the augments in the batch. This dependence is shown in FIG. 4.

The thus prepared particle-containing printing plates all have a better print run stability than common printing plates. Particularly in positive working printing plates, the number of copies is considerably higher both in baked and non-baked printing plates than in comparable plates which do not contain polymer particles according to the present invention.

In parameters relating to the copying technique such as resolution and photosensitivity, no measurable or relevant deterioration was observed with regard to the printing plates according to the invention in comparison with plates of the same composition—except the polymer which forms the particles. This also applies to the developability and the correctability of these printing plates.

The resistance to benzine-based plate and rubber detergents could even be improved in the plates according to the invention containing particles.

EXAMPLE

Example 1

In the following batches 1A–1D, the solids component are dissolved by the stated solvents. In all cases, the coating composition is transparent, i.e. there are no predispersed nuclei. After filtration of the solution, it is applied to an electrochemically roughened and anodized aluminum base, which was aftertreated with polyvinyl phosphonic acid, by means of common procedures and at first is dried without air supply and without heating. The afterdrying was carried out for 5 min at 100° C. The weight of the layer was in all cases 2 g/m$^2$.

TABLE 1

Figure 5:
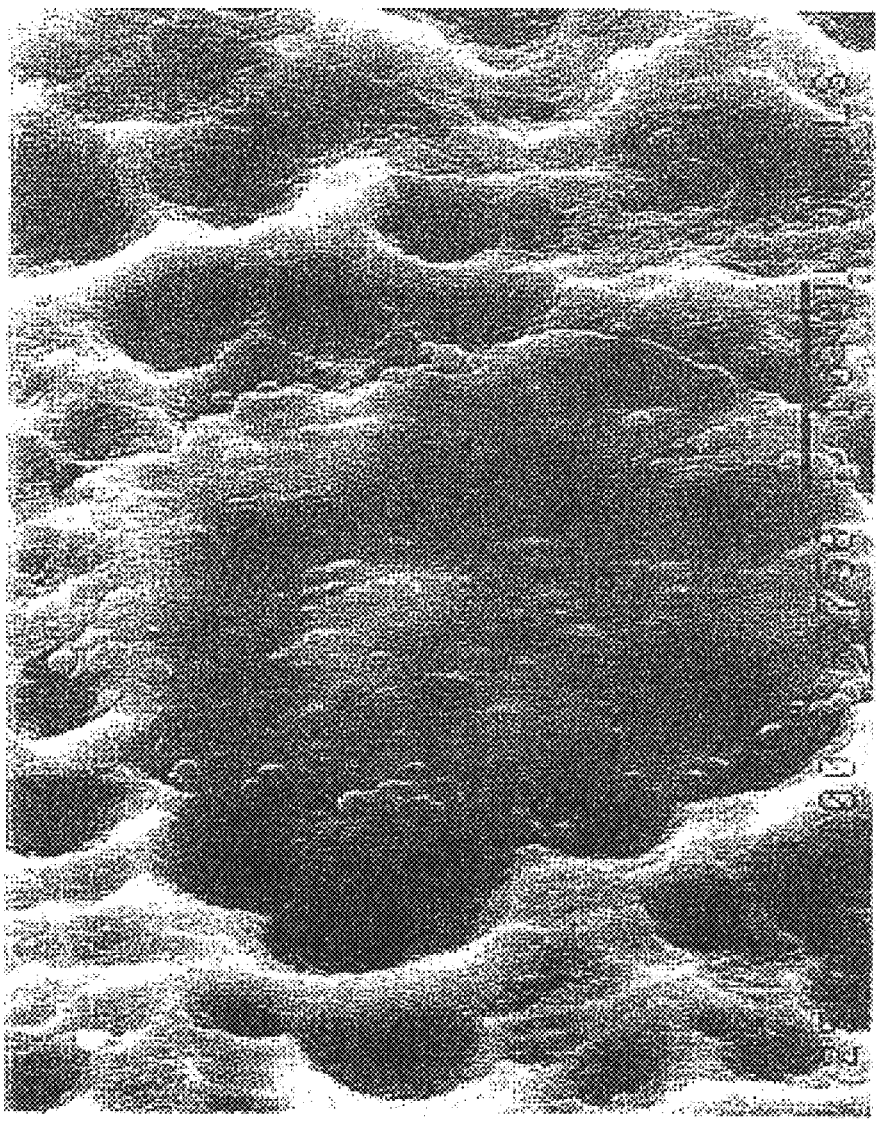
FIG. 5 shows a scanning electron micrograph of the printing plate prepared from batch 1B with particles prepared in-situ.

| component | 1A | 1B | 1C | 1D (comparative batch) |
|---|---|---|---|---|
| ester of naphthoquinone-1,2-diazido-5-sulfonic acid-chloride and 2,3,4-trihydroxybenzophenone | 1.199 g | 1.199 g | 1.199 g | 1.199 g |
| polymer of 40 weight % acrylonitrile, 10 weight % methylmethacrylate, 10 weight % methacrylamide and 40 weight % 1-(N'-(4-hydroxyphenyl)ureido)-methylmethacrylate | 2.441 g | 2.441 g | 2.441 g | 2.441 g |
| polymer of 14 weight % methacrylamide, 34 weight % N-phenylmaleimide and 52 weight % 1-(N'-(4-hydroxyphenyl)ureido)-methylmethacrylate | 1.220 g | 1.220 g | 1.220 g | 1.220 g |
| 2,4-trichloromethyl-6[1(4-methoxy)-naphthyl)]-1,3,5-triazine | 0.075 g | 0.075 g | 0.075 g | 0.075 g |
| ethyl violet | 0.064 g | 0.064 g | 0.064 g | 0.064 g |
| FC 431 (company 3M) non-ionogenic fluoroaliphatic polymeric esters | 0.003 g | 0.003 g | 0.003 g | 0.003 g |
| styrene-acrylonitril-copolymer (SAN 32, Bayer) | 0.880 g | | | |
| acrylbutadiene styrene-terpolymer (Lustran 452, Monsanto) | | 0.880 g | | |
| polymethylmethacrylate (Plexigum M914, Röhm) | | | 0.880 g | |
| butanone-2 | 6.750 g | 6.750 g | 6.750 g | 6.750 g |
| methylglycol | 2.250 g | 2.250 g | 2.250 g | 2.250 g |
| scanning electron micrograph | | FIG. 5 | | |

In plates 1A–C, the particles are well defined. The particle size is about 1–2 μm. The scanning electron micrograph of sample 1B is shown in FIG. 5.

The photocoating is exposed as positive copy under a silver film half-tone step wedge (UGRA-wedge filter) having a density range of 0.15 to 1.95, with the density increments being 0.15, by means of a metal halide lamp (MH-burner, 5000W, company Sack) with 800 mJ/cm$^2$.

The exposed layer is treated with a developer solution comprising 87.79 weight % demineralized water 9.20 weight % soda waterglass 2.10 weight % sodium hydroxide 0.90 weight % ethylene glycol 0.01 weight % tetramethyl ammonium chloride (aqueous solution, 50%)

for 15 s. Subsequently, the developer solution is again spread on the surface for 5 s with a wet piece of cloth. Then the entire plate is rinsed with water. After this treatment, the non-exposed parts remain on the plate. For assessing the photosensibility and the ink acceptance, the wet plate is inked up with a printing ink. As printing ink, the products PC 904™ (company Polychrome) and RC 43™ (company Hoechst) are used.

The photosensibilities of the layers from batches 1A–1C are identical with the photosensitive layer 1D which was prepared according to the same formulation—but without the developer-insoluble polymer—as the gray-wedge values in table 2 show. Also, formed microlines were reproduced equally well in all plates.

In order to be able to assess the developability of the exposed layer and in order to compare it with other formulations, the procedure is as follows: In intervals of 5 s, strips of the exposed plate are charged with the above developer solution by means of a pipet. After a reaction time of 20 s, the entire plate is quickly rinsed with water, inked up with printing ink and then dried. The point in the reaction time of the developer when no more ink is taken up by the layer after the inking up is determined. In the following, this test will be referred to as drop test.

In order to assess the resistance of the unexposed layer (of the image areas) to developers, stripes of an unexposed plate are charged with the above-mentioned developer solution by means of a pipefte every 30 s. After a reaction time of 4 min, the entire plate is quickly rinsed with water. Then, the point in the reaction time of the developer when the layer shows clear brightening is determined. In the following, this test will be referred to as soak test.

The printing plates 1A–D were subjected to an abrasion test which provides information about the mechanical abrasion resistance of the layer. In this test, a piece of cloth soaked with an aqueous abrasive suspension is rubbed over the printing plate with oscillating movements for a pre-defined period of time (15 min). This test was carried out in thermally untreated (non-baked) and thermally treated (baked) plates. The baked samples were heated to 250° C. in an oven for 8 min. While in non-baked samples, a fine-grained abrasive was used, a coarse-grained abrasive was used in baked samples. The lower the weight losses in this method, the higher is the mechanical resistance of a sample. This test was adjusted via the selection of the abrasive emulsion such that a qualitative prediction regarding the number of copies of the printing plate in a printing machine can be made.

The results of the above-explained tests are shown in table 2.

TABLE 2

| Sample | weight loss [g/m$^2$] (non-baked plate) | weight loss [g/m$^2$] (baked plate) | free grades in the UGRA gray-wedge | drop test [s] | soak test [s] |
|---|---|---|---|---|---|
| 1A | 0.33 | 0.16 | 3 | <5 | >150 |
| 1B | 0.27 | 0.20 | 3 | <5 | >150 |
| 1C | 0.50 | 0.33 | 3 | <5 | >150 |
| 1D (without particles) | 0.53 | 0.40 | 3 | <5 | >150 |

As the example shows, it makes no difference with regard to the copying parameters (drop test/gray-wedge/microlines) whether the plate contains particles or not.

However, the plates according to the invention containing particles show a clear increase of the mechanical stability. In particular it is to be emphasized that in this case, not only the non-baked layer shows a considerably better mechanical stability but the baked layer does as well.

Example 2

From the formulations in table 3, plates are prepared as in Example 1.

TABLE 3

| component | 2A (comparative batch) | 2B | 2C | 2D | 2E | 2F | 2G |
|---|---|---|---|---|---|---|---|
| ester of naphtho-quinone-1,2-diazido-5-sulfonic acid-chloride and 2,4-dihydroxy-benzophenone | 1.199 g | 1.199 g | 1.199 g | 1.199 g | 1.199 g | 1.199 g | 1.199 g |
| cresol/formaldehyde novolak resin (meta:para = 75/25), mw = 7000 | 3.661 g | 3.661 g | 3.661 g | 3.661 g | 3.661 g | 3.661 g | 3.661 g |
| 2,4-trichloromethyl-6[1(4-methoxy)-napthyl)]1,3,5-triazine | 0.075 g | 0.075 g | 0.075 g | 0.075 g | 0.075 g | 0.075 g | 0.075 g |
| ethyl violet | 0.064 g | 0.064 g | 0.064 g | 0.064 g | 0.064 g | 0.064 g | 0.064 g |
| FC 431 (company 3M) non-ionogenic | 0.003 g | 0.003 g | 0.003 g | 0.003 g | 0.003 g | 0.003 g | 0.003 g |

TABLE 3-continued

| component | 2A (comparative batch) | 2B | 2C | 2D | 2E | 2F | 2G |
|---|---|---|---|---|---|---|---|
| fluoroaliphatic polymeric esters styrene-acrylonitril-polymer (SAN 32, Bayer) | 0.880 g | 0.880 g | 0.880 g | 0.880 g | 0.880 g | 0.880 g | 0.880 g |
| butanone-2 | 9.000 g | 8.550 g | 8.100 g | 7.650 g | 7.200 g | 6.750 g | 6.300 g |
| methylglycol | — | 0.450 g | 0.900 g | 1.350 g | 1.800 g | 2.250 g | 2.700 g |

The samples are subjected to the abrasion test both in baked and non-baked condition, as described in Example 1. The particle sizes were determined on the basis of the scanning electron micrographs. The values are shown in table 4.

TABLE 4

| sample no. | concentration of [B] [weight %] | weight loss non-baked [g/m$^2$] | weight loss baked [g/m$^2$] | average particle size [μm] |
|---|---|---|---|---|
| 2A comparison | 0 | 0.57 | 0.59 | — |
| 2B | 5 | 0.47 | 0.61 | 0,5 |
| 2C | 10 | 0.26 | 0.46 | 1 |
| 2D | 15 | 0.14 | 0.41 | 2 |
| 2E | 20 | 0.07 | 0.29 | 3 |
| 2F | 25 | 0.06 | 0.29 | 3,5 |
| 2G | 30 | 0.1 | 0.27 | 4 |

Figure 6:
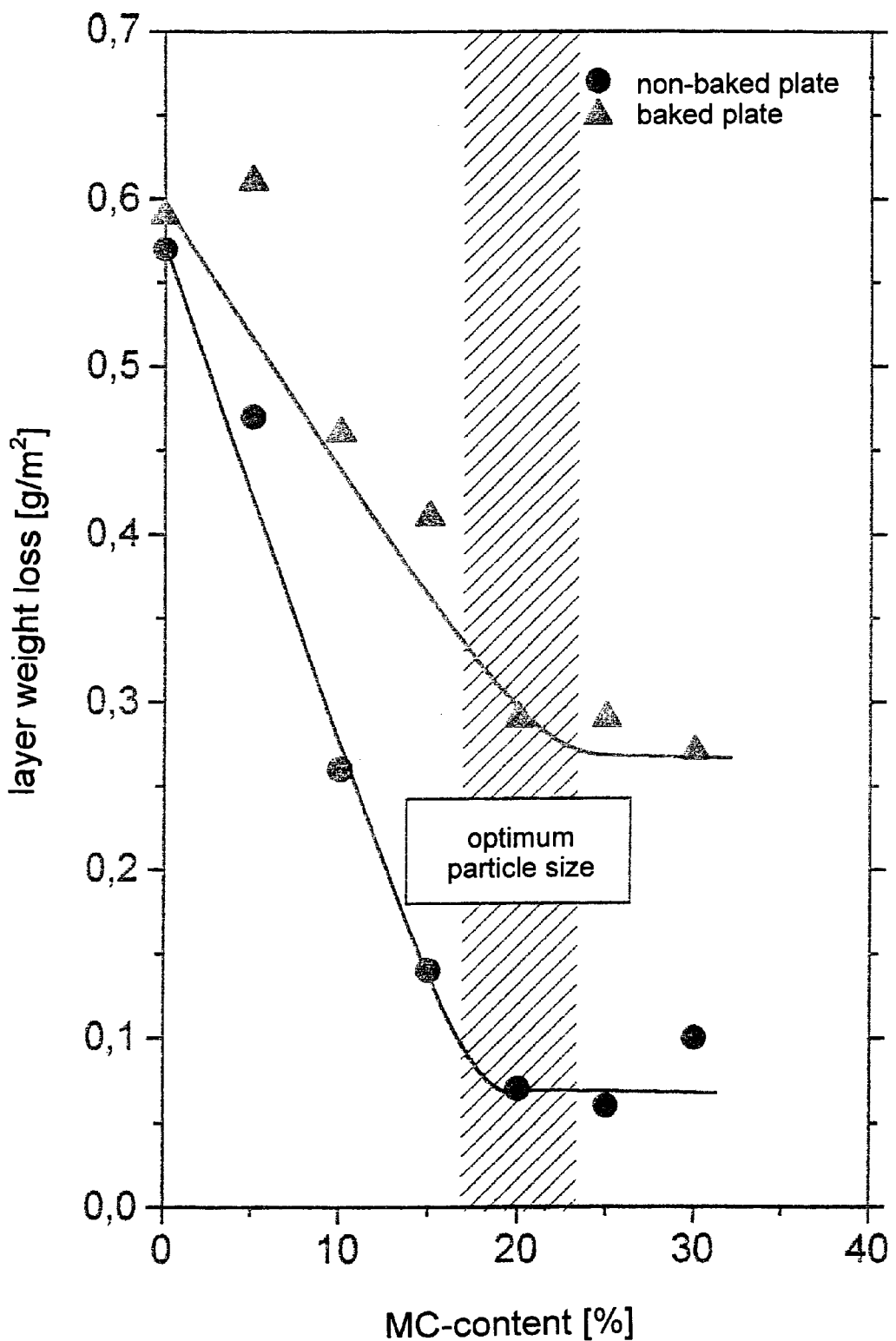
FIG. 6 shows the layer weight losses vis-a-vis the methylglycol/butanone ratio (Example 2).

In FIG. 6, the weight losses vis-a-vis the methyl glycol (MC)/butanone ratio in the solvent (in weight %) are shown.

As can be seen from FIG. 6, the mechanical stability of a plate with the same solids composition strongly depends on the ratio between high-volatility solvent component (butanone) and low-volatility solvent component (methyl glycol). In this Example, the optimum is only reached at a concentration of about 20 weight % of low-volatility component (methyl glycol). In this system, this corresponds to an average particle size of ≧3 μm. This particle size corresponds to the layer thickness. In low methyl glycol concentrations, this optimum particle size has not been completely reached. It is to be clearly stated that the mechanical stability could also be considerably increased in baked plates, i.e. the particles fulfil their function also after a heat treatment at ≧250° C.

Example 3

From the substances listed in table 5, a basic batch is prepared.

TABLE 5

| component | amount |
|---|---|
| ester of naphthoquinone-1,2-diazido-5-sulfonic-acid-chloride and 2,3,4-trihydroxybenzophenone | 1.199 g |
| cresol/formaldehyde novolak resin (meta:para = 75/25), Mw = 7000 | 3.661 g |
| polymer from 40 weight % acrylonitrile, 10 weight % methylmethacrylate, 10 weight % methacrylamide and 40 weight % 1-(N'-(4-hydroxyphenyl)ureido)-methylmethacrylate | 2.441 g |
| polymer from 14 weight % methacrylamide, 34 weight % N-phenylmaleimide und 52 weight % 1-(N'-(4-hydroxyphenyl)ureido)-methylmethacrylate | 1.220 g |

TABLE 5-continued

| component | amount |
|---|---|
| 2,4-trichloromethyl-6[1(4-methoxy)-naphthyl)]1,3,5-triazine | 0.075 g |
| ethyl violet | 0.064 g |
| FC 431 (company 3M) non-ionogenic fluoroaliphatic polymeric esters | 0.003 g |
| butanone-2 | 5.000 g |
| methylglycol | 4.000 g |

This basic batch is used as starting basis and the respective amounts of particle-forming polymer stated in table 6 are added thereto. From these batches, plates are prepared and subjected to the abrasion test, both in non-baked and in baked condition, as in Example 1.

TABLE 6

| concentration of styrene acrylonitrile-copolymer (SAN 32, Bayer) [weight %] | addition of polymer [g] to the basic batch | weight loss non-baked [g/m$^2$] | weight loss baked [g/m$^2$] | average particle size [μm] |
|---|---|---|---|---|
| 0% | 0 | 0.53 | 0.40 | — |
| 5% | 0.26 | 0.50 | 0.44 | 2.5 |
| 10% | 0.55 | 0.30 | 0.31 | 3 |
| 15% | 0.88 | 0.33 | 0.16 | 3 |
| 20% | 1.25 | 0.26 | 0.23 | 3 |

Figure 7:
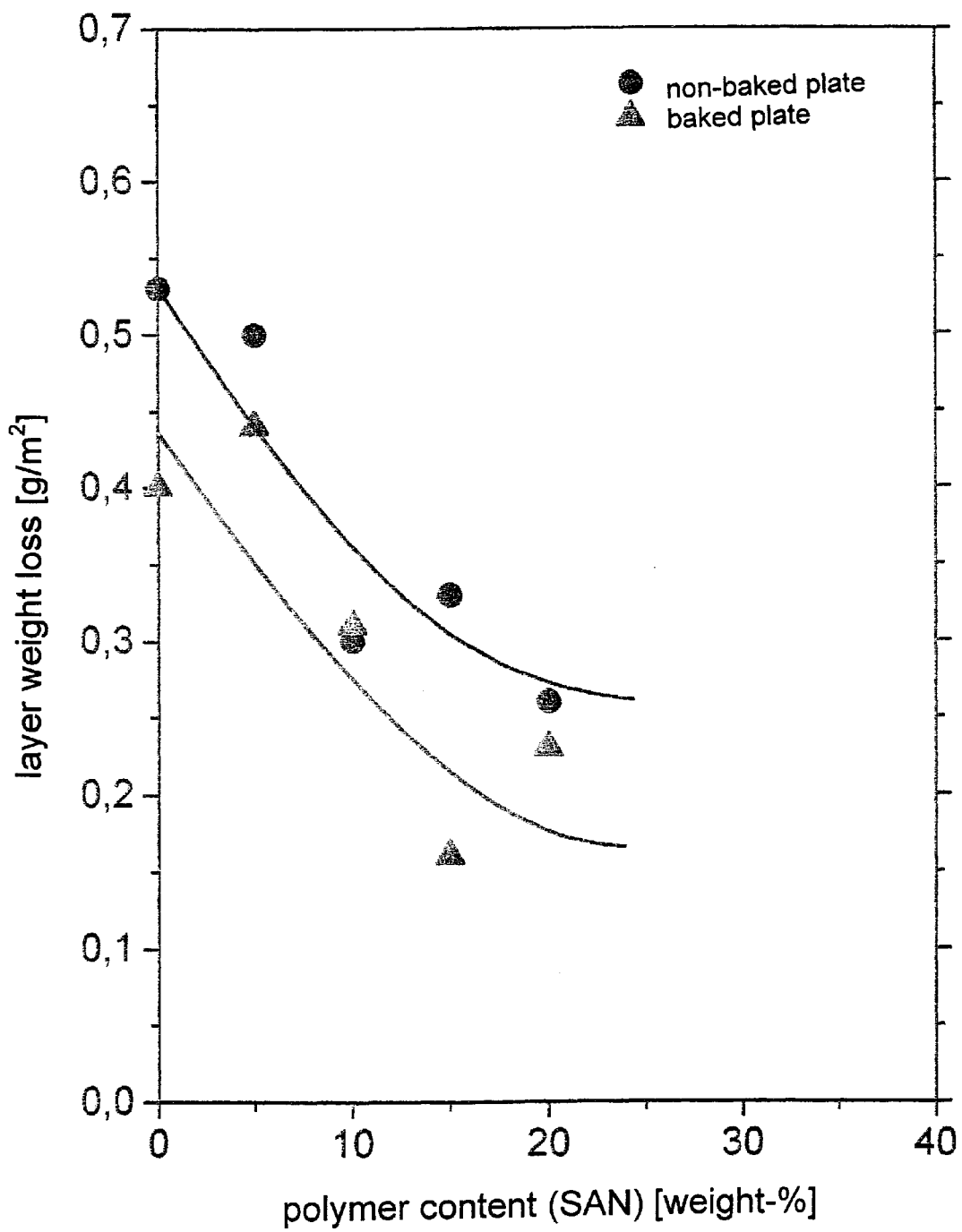
FIG. 7 shows the dependence of the abrasion resistance on the content of particle-forming polymer in the composition used (Example 3).

The values obtained in Table 6 are again shown in FIG. 7.

As can be taken from FIG. 7, the amount of developer-insoluble polymer in the layer comprises a decisive portion of the mechanical resistance. The higher the proportion of polymer, the higher is the number of particles and the lower is the loss of layer weight after mechanical strain (abrasion test).

Example 4

From the following batches (Table 7) plates are prepared, as described in Example 1.

TABLE 7

| component | 4A | 4B | 4C | 4D | 4E | 4F | 4G | 4H (comparative batch) |
|---|---|---|---|---|---|---|---|---|
| ester of a low-molecuar novolak with 1,2-naphthoquinone-diazid-4-sulfonic acid | 1.413 g | 1.413 g | 1.413 g | 1.413 g | 1.413 g | 1.413 g | 1.413 g | 1.413 g |
| cresol/formaldehyde novolak resin (meta:para = 75/25), mw = 7000 | 3.478 g | 3.478 g | 3.478 g | 3.478 g | 3.478 g | 3.478 g | 3.478 g | 3.478 g |
| 2,4-trichloromethyl-6[1(4-methoxy)-napthyl)]1,3,5-triazine | 0.030 g | 0.030 g | 0.030 g | 0.030 g | 0.030 g | 0.030 g | 0.030 g | 0.030 g |
| ethyl violet | 0.080 g | 0.080 g | 0.080 g | 0.080 g | 0.080 g | 0.080 g | 0.080 g | 0.080 g |
| FC 431 (company 3M) non-ionogenic fluoroaliphatic polymeric esters | 0.007 g | | | 0.008 g | | | 0.008 g | 0.007 g |
| polydimethylsiloxane with 65 weight % oligomeric ethyleneoxide/propylene-oxide side groups [40:60], (mw = 20.000) | | 0.003 g | 0.005 g | | 0.005 g | 0.005 g | | |
| acrytonitril-styrene/butadiene-copolymer (Lustran 452, Monsanto) | 0.880 g | | | | | | | |
| polysulfone (Udel P1800, Amoco) | | 0.880 g | | | | | | |
| styreneacrylonitnI-copolymer (SAN 32, Bayer) | | | 0.880 g | | | | | |
| polycarbonate (Makrolon 3108, Bayer) | | | | 0.880 g | | | | |
| styrenebutadiene-blockpolymer (Styroflex ™, BASF) | | | | | 0.880 g | | | |
| acrylonitril-styrene-acryl-copolymer (ASA, BASF) | | | | | | 0.880 g | | |
| poiystyrene (PS 168N, BASF) | | | | | | | 0.880 g | |
| dioxolane | | 38.250 g | | | | | | |
| dioxan | 38.250 g | | | | | | | |
| tetrahydrofuran | | | | 38.250 g | | | | |
| butanone-2 | | | 38.250 g | | | | 38.250 g | 38.250 g |
| ethylacetate | | | | | 38.250 g | 38.250 g | | |
| ethylglycol | | | | 6.750 g | | | | |
| methanol | | 6.750 g | | | | 6.750 g | | |
| methylglycol | 6.750 g | | | | 6.750 g | | | |
| 1-methoxy-propanol-2 | | | 6.750 g | | | | 6.750 g | 6.750 g |

The thus prepared plates are examined by means of an electron-scanning microscope; furthermore, as in Example 1, the abrasion resistance is assessed; the values are given in Table 8.

For preparing a printing plate, a light-sensitive coating is applied to the aluminum base, then exposed and developed, and the plate is squeezed with water after rinsing and rubbed with an aqueous solution of 0.5% phosphoric acid and 6% gum arabic, as described in Example 1. The thus prepared plate is fit into the sheet-fed offset press (type Favorit, MAN Roland) and printed under common conditions. The number of copies of some plates are shown in Table 8.

During printing, the machine is stopped every 10,000 revolutions and the plate is rinsed with a plate detergent consisting of 85% by volume benzine and 15% by volume isopropanol. In order to test in advance whether the plate's print run stability is influenced by this chemical treatment, the following laboratory test ("detergent test") is carried out: A strip of a plate is exposed half-sided and immersed in a solution of 85% by volume benzine and 15% by volume isopropanol. Every 60 s, a cloth is rubbed over the plate with the pressure being defined. The time after which both the exposed and non-exposed sides show a clear brightening of the layer after rubbing is determined.

TABLE 8

Figure 8:
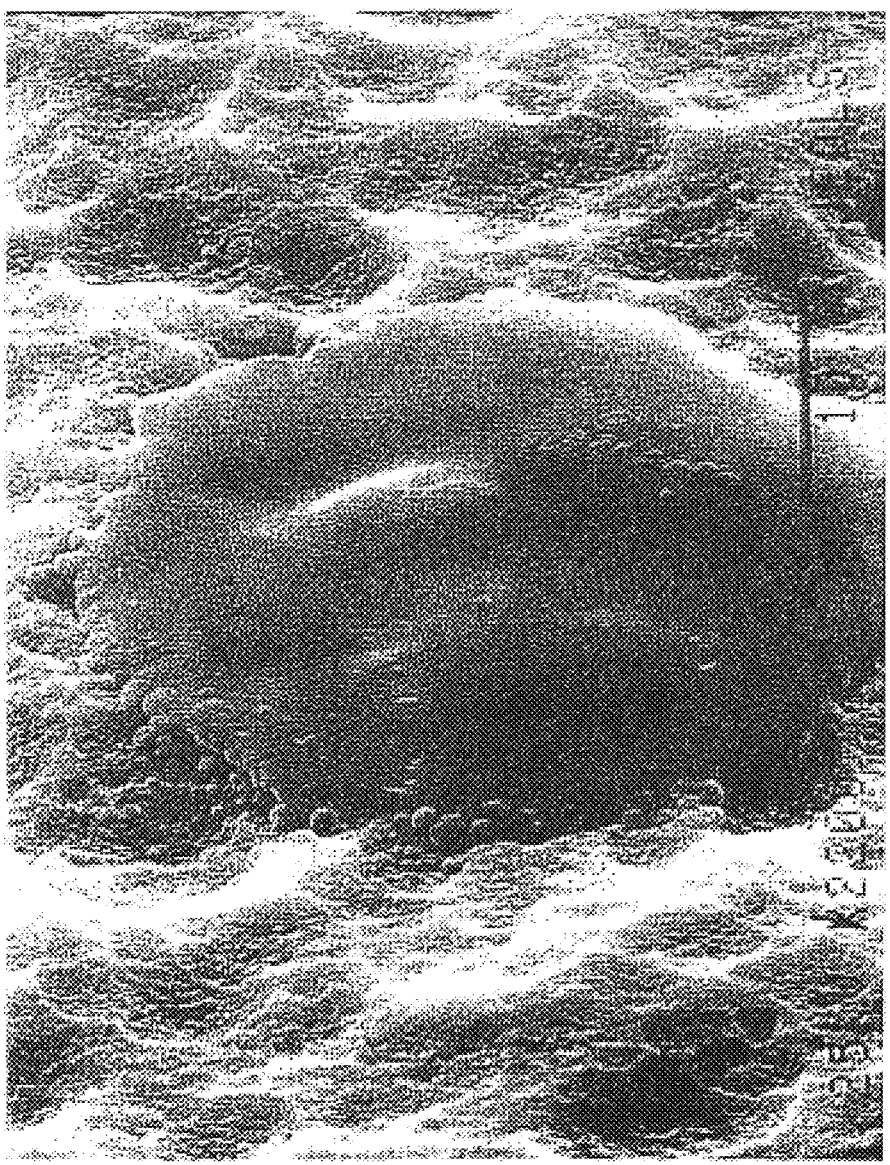
FIG. 8–FIG. 19 show scanning electron micrographs of printing plates (before and after printing) prepared from compositions 4A–4H (Example 4).
Figure 9:
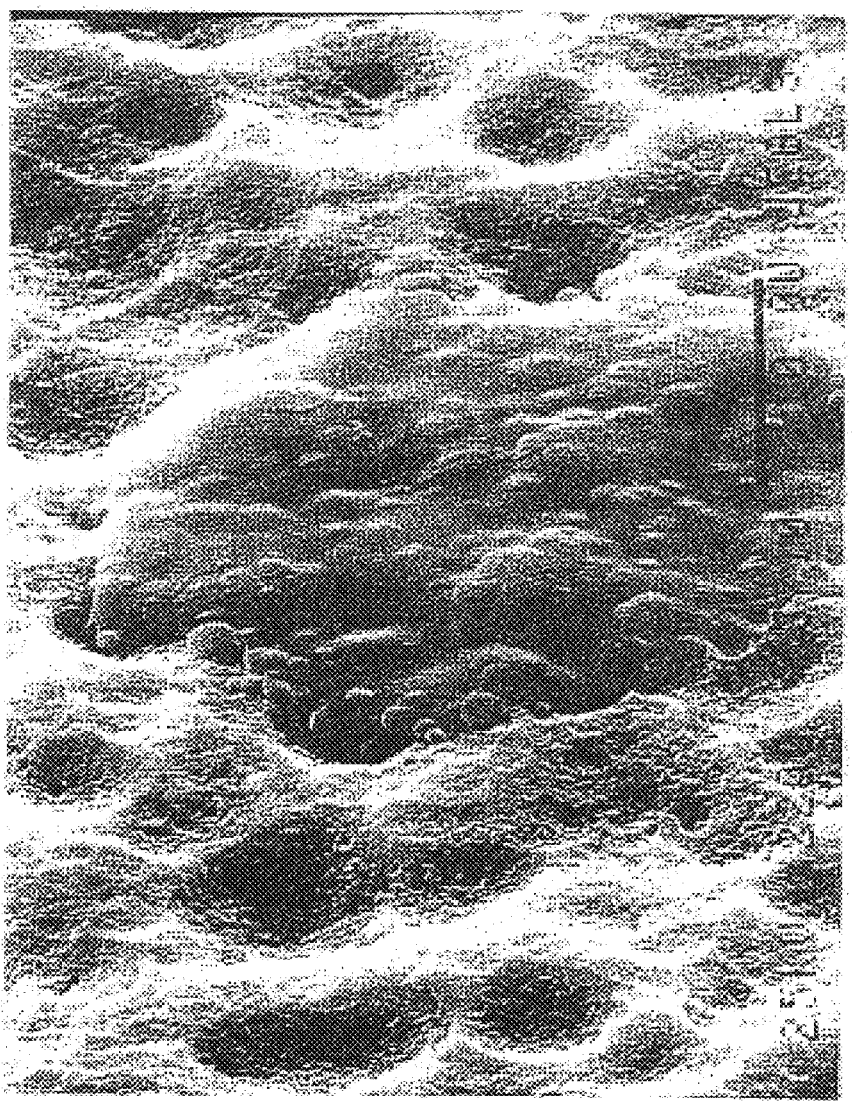
Figure 10:
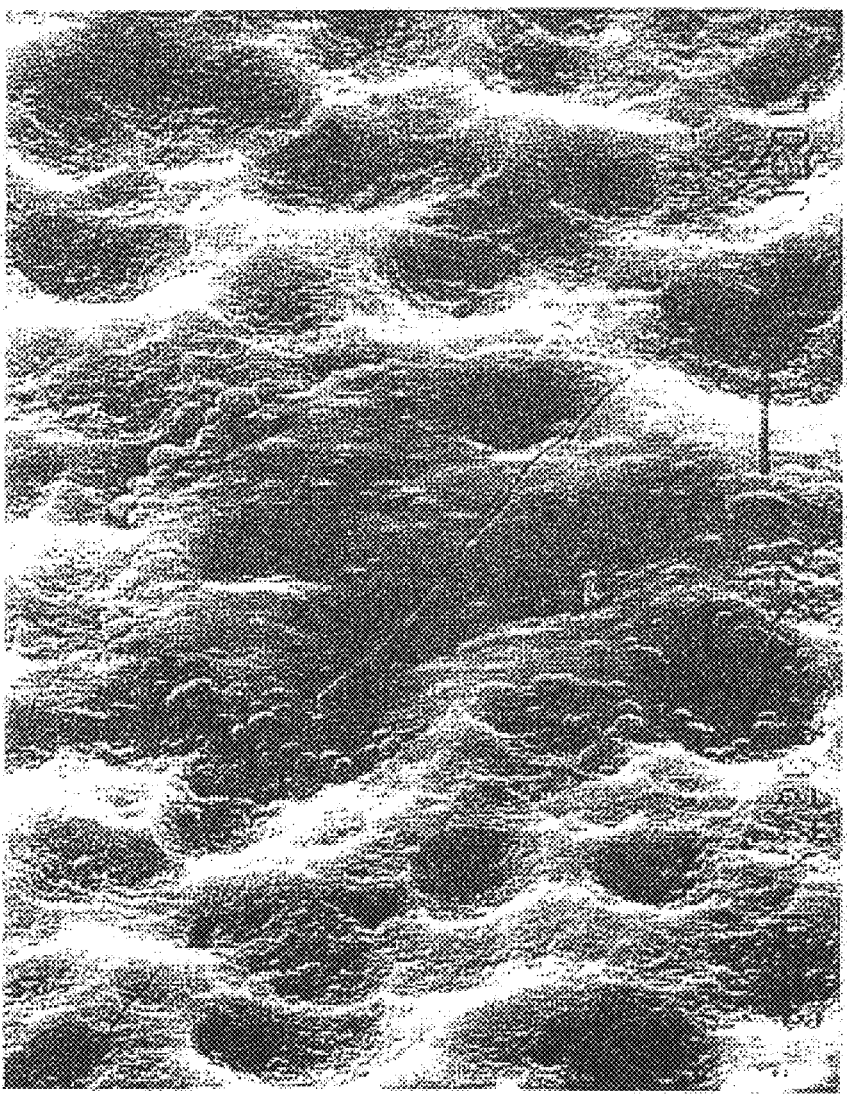
Figure 11:
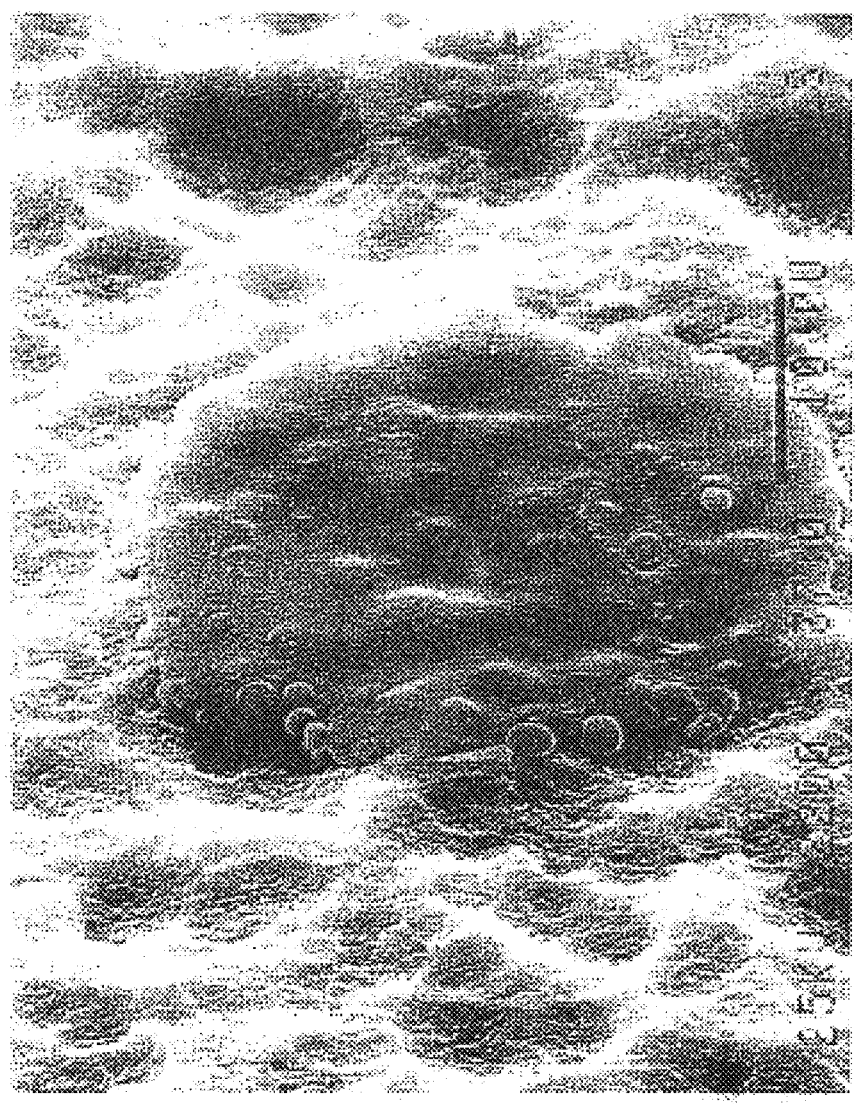
Figure 12:
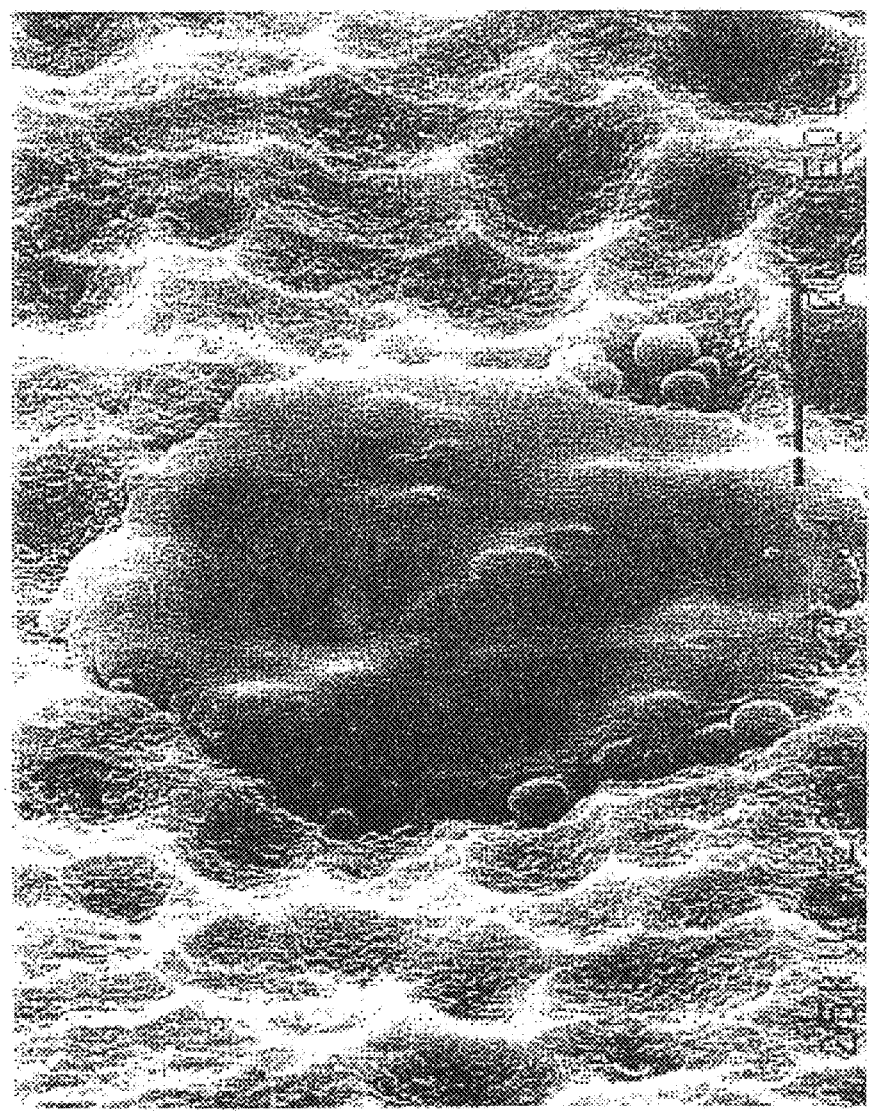
Figure 13:
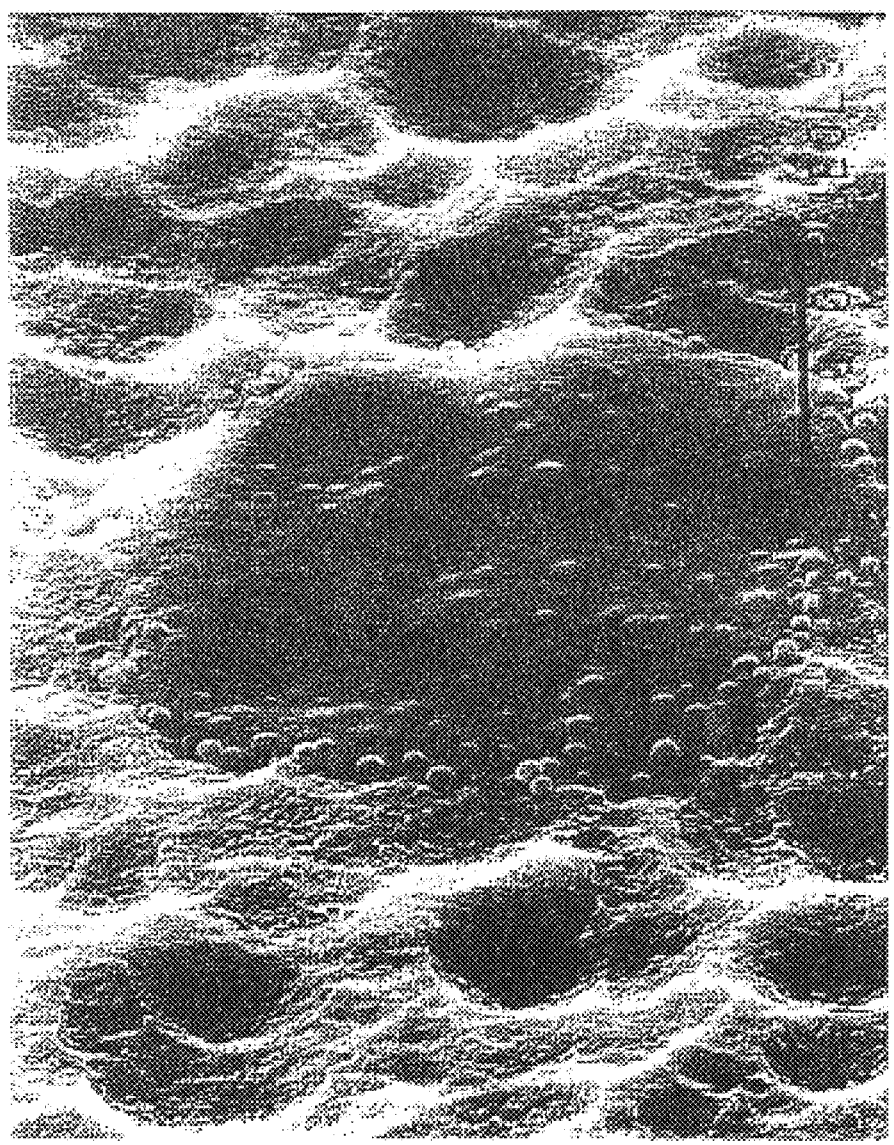
Figure 14:
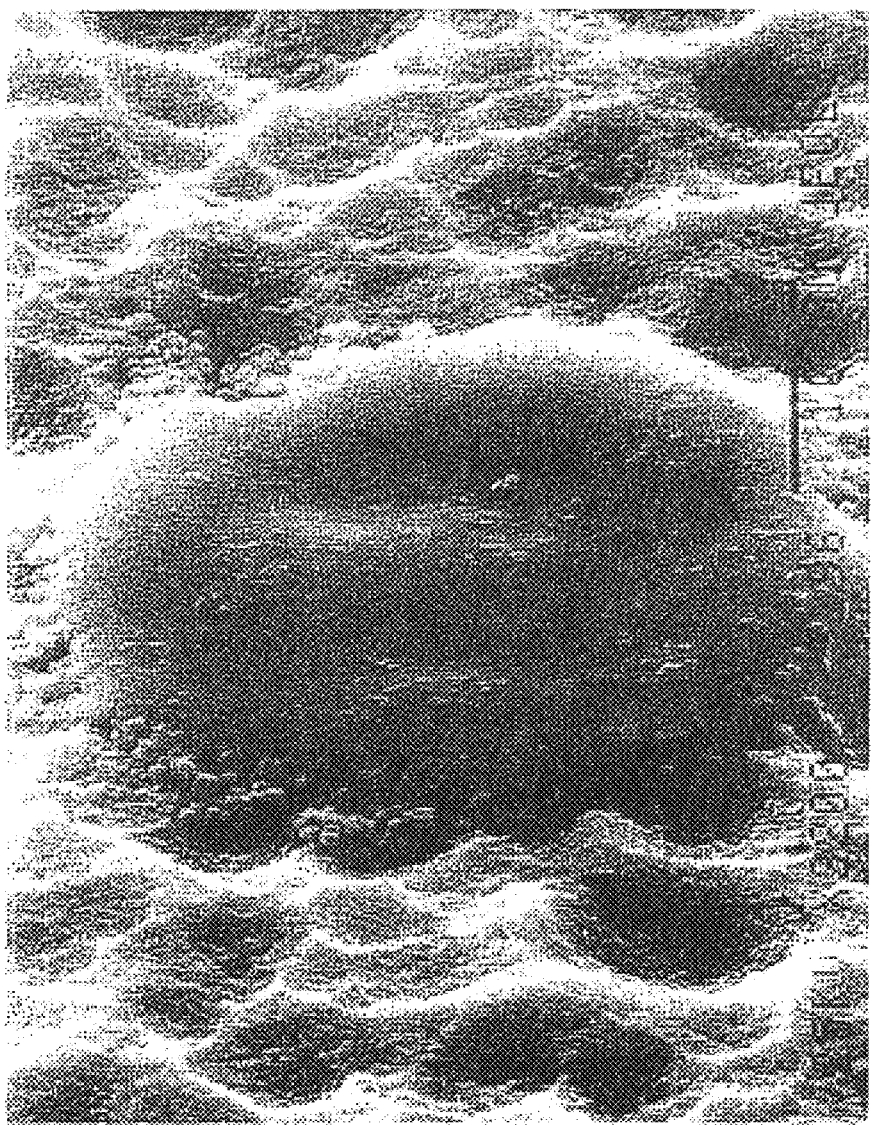
Figure 15:
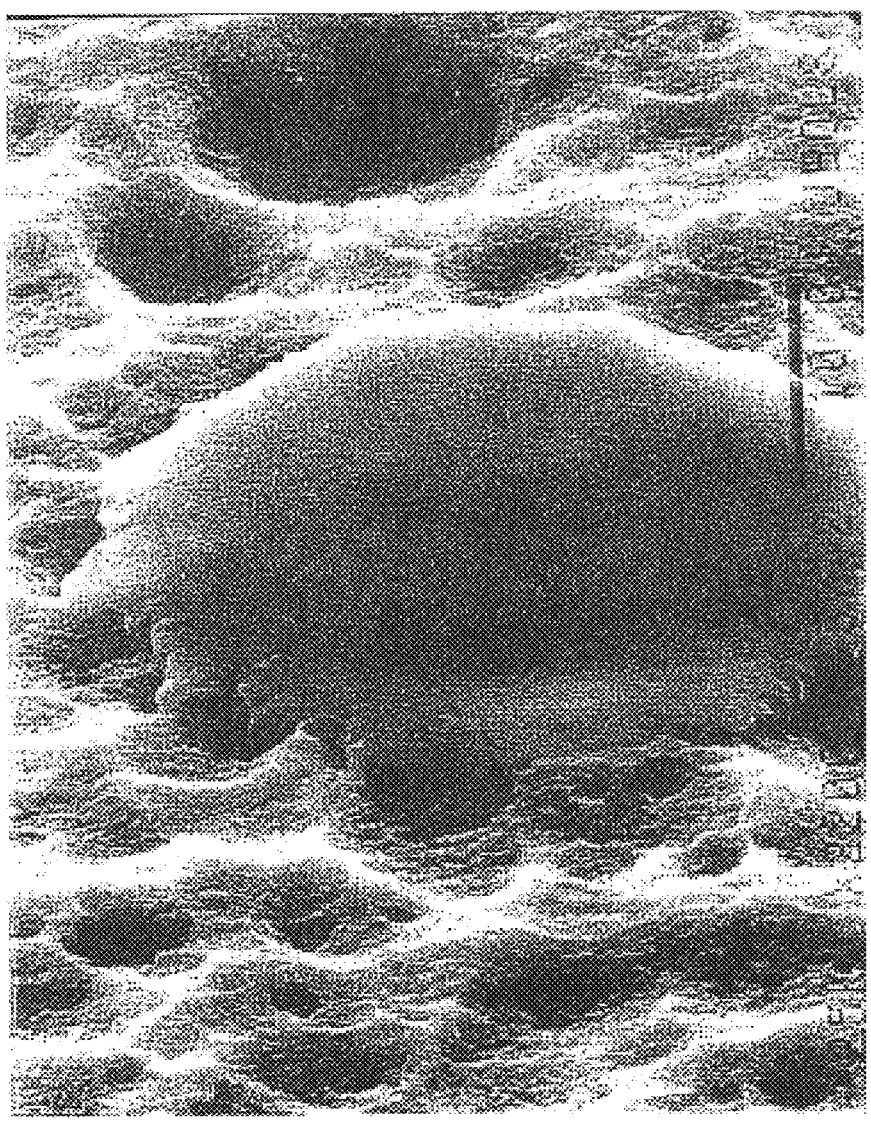
Figure 16:
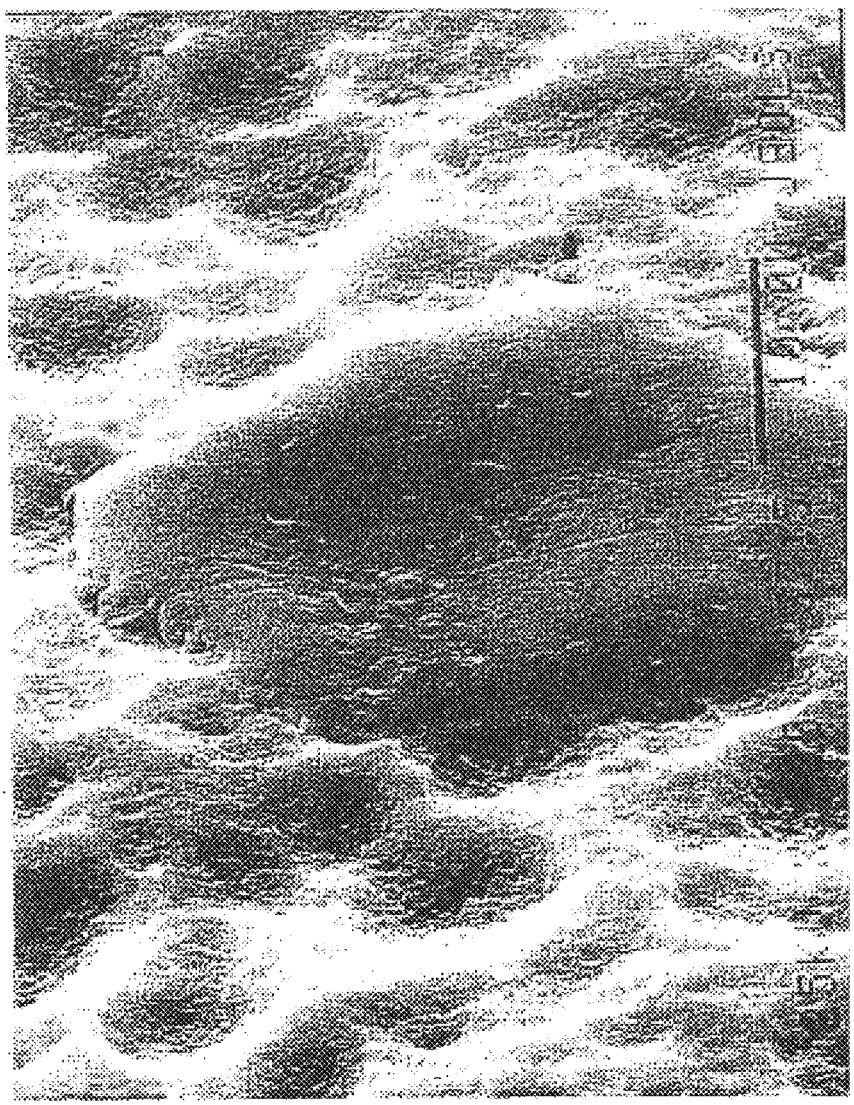
Figure 17:
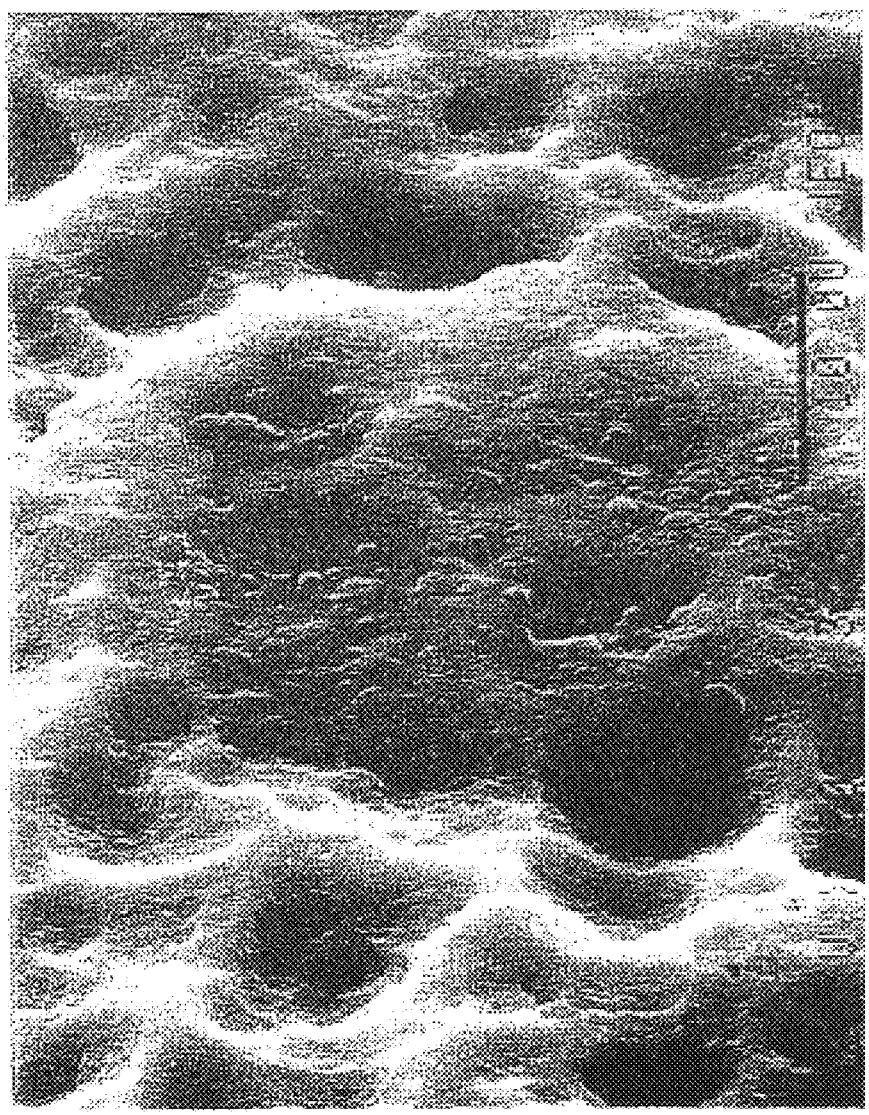
Figure 18:
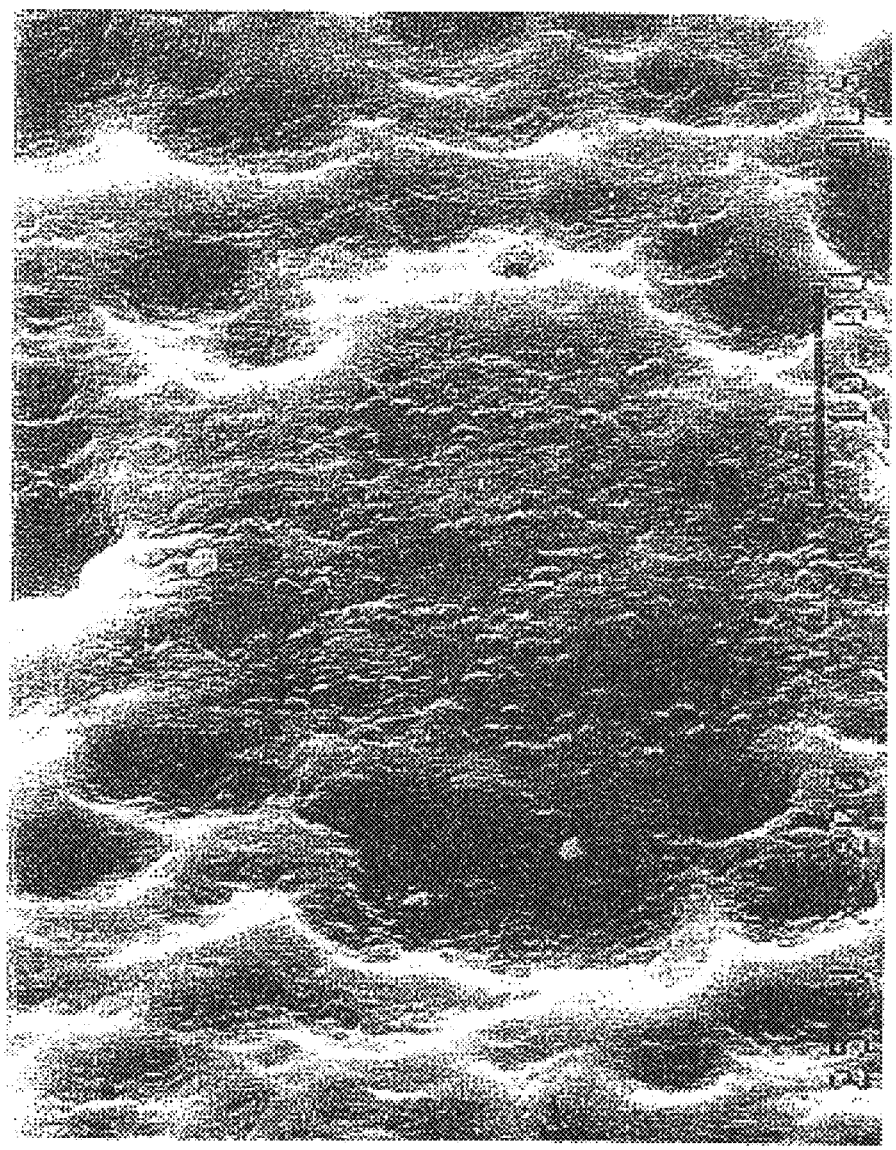
Figure 19:
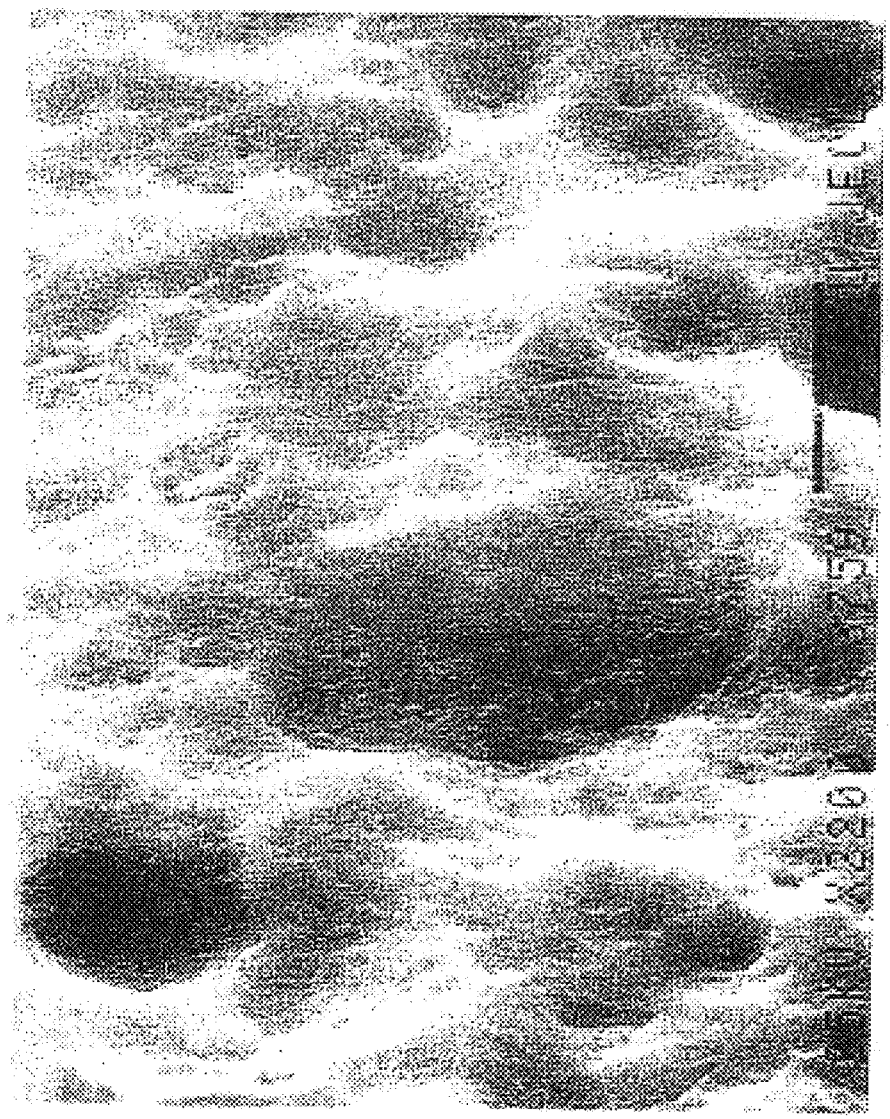

|  | 4A | 4B | 4C | 4D | 4E | 4F | 4G | 4H (comparison) |
|---|---|---|---|---|---|---|---|---|
| drop test[s] | <5 | <5 | <5 | <5 | <5 | <5 | <5 | <5 |
| soak test [s] | >150 | >150 | >120 | >150 | >120 | >120 | >150 | >120 |
| abrasion test: |  |  |  |  |  |  |  |  |
| layer loss non-baked [g/m$^2$] | 0.36 | 0.36 | 0.27 | 0.31 | 0.10 | 0.33 | 0.30 | 0.89 |
| layer loss baked [g/m$^2$] | 0.41 | 0.30 | 0.44 | 0.36 | 0.73 | 0.54 | 0.64 | 0.77 |
| detergent test: |  |  |  |  |  |  |  |  |
| exposed side [min] | 4 | 5 | 4 | 4 | 3 | 4 | 5 | 4 |
| unexposed side [min] | 8 | 9 | 8 | 8 | 6 | 9 | 8 | 7 |
| number of copies | 220.000 | 190.000 | — | 190.000 | — | — | — | 110.000 |
| corresponding electron-scanning microscope photo before printing | FIG. 8 | FIG. 9 | FIG. 10 | FIG. 11 | FIG. 12 | FIG. 13 | FIG. 14 | FIG. 15 |
| corresponding electron-scanning microscope photo after printing | FIG. 16 | FIG. 17 | — | FIG. 18 | — | — | — | FIG. 19 |

The scanning electron micrographs (FIG. 8–FIG. 19) show the plates of some batches from Table 7 both before and after printing.

The scanning electron micrographs clearly show that the plates which contain polymer particles still have sufficient remaining layer after printing so that the printing of these plates could be continued. The reference plate (batch 4H) without particles has only a very small portion of layer on the printing areas; a continuation of printing is not possible.

As this example shows, the particles achieve a considerable increase in the number of copies (up to twice the amount) compared to a plate which has approximately the same composition but does not contain the particle-forming polymer.

Example 5

From the following batches (Table 9), plates are prepared, as described in Example 1.

TABLE 9

| component | 5A | 5B | 5C [comparison] | 5D [comparison] |
|---|---|---|---|---|
| ester from naphthoquinone-1,2-diazido-5-sulfonic acid-chloride and 2,4-dihydroxy-benzophenone | 0.25 g | 0.25 g | 0.25 g | 0.25 g |
| copolymer from acrylic acid and other various acrylates (Carboset XPD-2000, Goodrich) | 0.50 g | — | 0.55 g | — |
| alkyd resin containing 42% by weight coconut oil and 32% by weight | — | 0.50 g | — | 0.55 g |

TABLE 9-continued

| component | 5A | 5B | 5C [comparison] | 5D [comparison] |
|---|---|---|---|---|
| phthalic acid anhydride (Alftalat AC 421, Hoechst) (80% solution in isopropanol) |  |  |  |  |
| cresol/formaldehyde novolak resin (meta: para = 75/25), mw = 7000 | 0.15 g | 0.15 g | 0.20 g | 0.20 g |
| 2,4-trichloromethyl-6[1 (4-methoxy)-napthyl)] 1,3,5-triazine | 0.01 g | 0.01 g | 0.01 g | 0.01 g |
| ethyl violet | 0.01 g | 0.01 g | 0.01 g | 0.01 g |
| polydimethylsiloxane having 65% by weight oligomeric ethyl oxide/ propyleneoxide [40:60] side groups, (mw = 20.000) | 0.01 g | 0.01 g | 0.01 g | 0.01 g |
| styreneacrylonitril-copolymer (SAN 32, Bayer) | 0.10 g | 0.10 g | — | — |
| butanone-2 | 7.00 g | 7.00 g | 7.00 g | 7.00 g |
| 1-methoxy-propanol-2 | 2.00 g | 2.00 g | 2.00 g | 2.00 g |

The assessment of these plates is shown in Table 10. The copying properties and the developability of the samples 5A–5B and the comparative samples without addition of polymer 5C–5D are hardly different from each other.

TABLE 10

Figure 20:
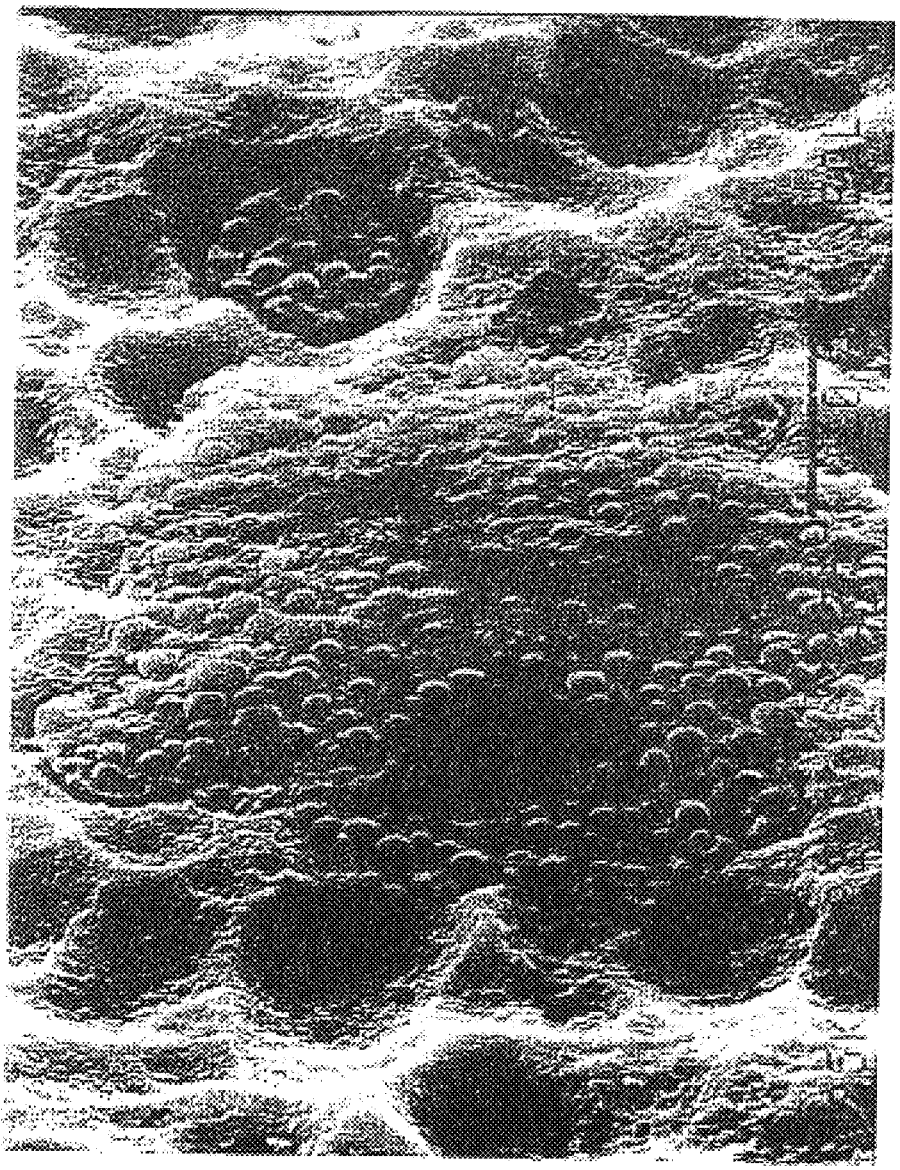
FIG. 20–FIG. 21 show scanning electron micrographs of printing plates prepared from compositions 5A–5B (Example 5).
Figure 21:
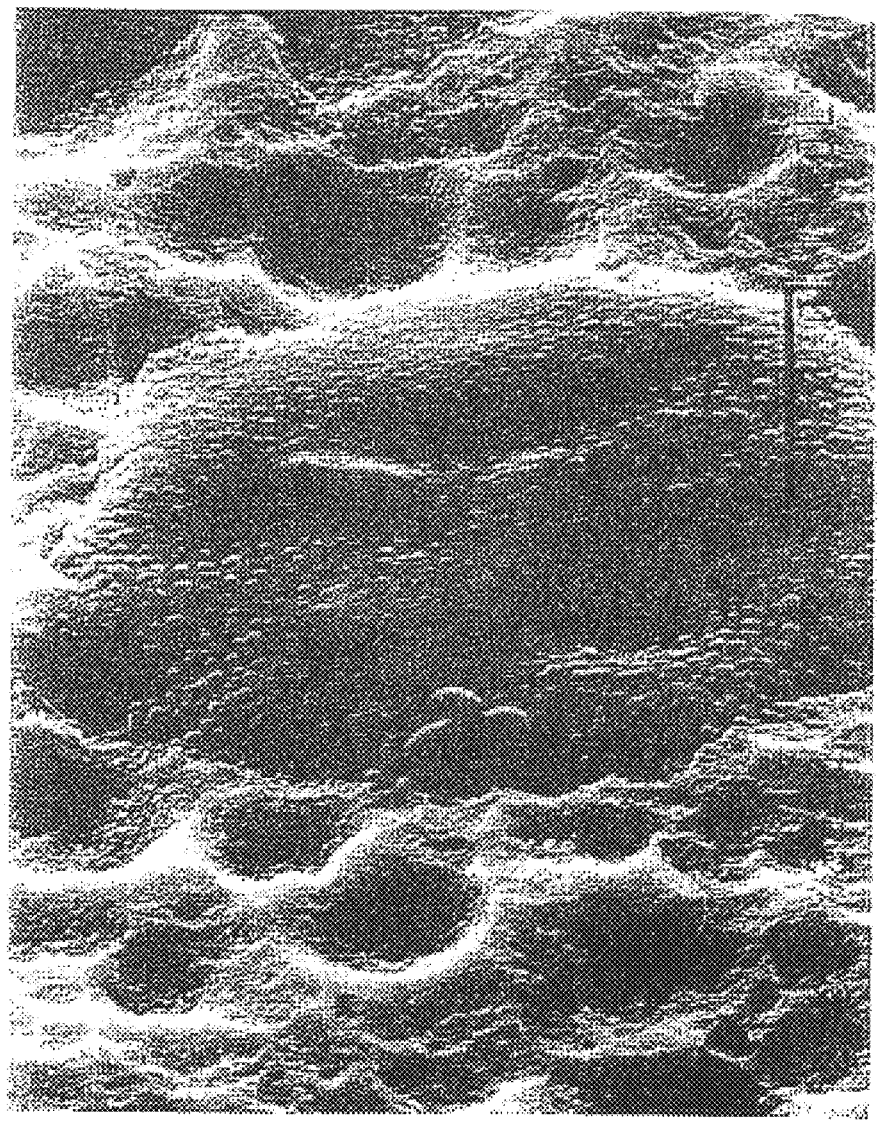

|  | 5A | 5B | 5C comparison | 5D comparison |
|---|---|---|---|---|
| free grades in the UGRA gray-wedge | 2–3 | 2–3 | 2–3 | 3 |
| drop test [s] | <5 | <5 | <5 | <5 |
| soak test [s] | >120 | >90 | >120 | >90 |
| abrasion values [g/m$^2$] | 0.06 | 0.01 | 0.29 | 0.39 |
| scanning electron micrographs | FIG. 20 | FIG. 21 |  |  |

As the abrasion values in this example show, the mechanical stabilization of the layer is also possible in positive working plates, which do not contain the common novolak-based binders. The mechanical stability of these plates having particles is clearly increased compared to that of the plates without particles.

Example 6

From the components shown in Table 11, a solution for a negative working photosensitive composition is prepared.

TABLE 11

Figure 22:
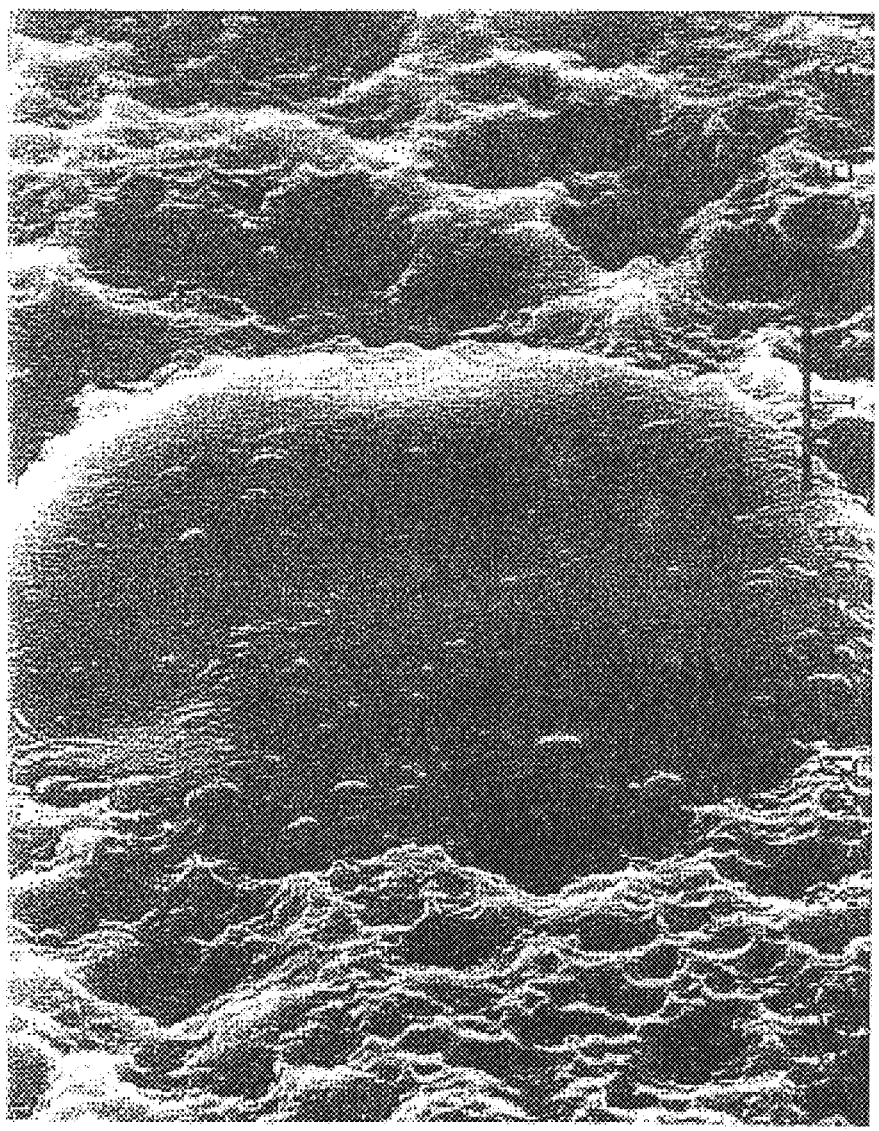
FIG. 22 shows a scanning electron micrograph of a printing plate prepared from composition 6C (Example 6).

| component | 6A | 6B | 6C |
|---|---|---|---|
| terpolymer prepared by polymerization of 4.76 g styrene, 4.76 g methylmethacrylate and 1.06 g methacrylic acid | 2.1 g | 2.1 g | 2.1 g |
| 80% methylethylketone-solution of a urethane acrylate prepared by reacting Desmodur N100 ™ (company Bayer) with hydroxyethylacrylate and pentaerythritol-triacrylate with a double bond content of 0.5 double bonds/100 g when the isocyanate groups are completely reacted | 5.24 g | 5.24 g | 5.24 g |
| dipentaerythritolpentaacrylate | 1.29 g | 1.29 g | 1.29 g |
| 2,4-trichloromethyl-6[(4-ethoxyethylenoxy)-naphthyl]-1,3,5-triazine | 0.6 g | 0.6 g | 0.6 g |
| polysulfone (Udel P1800, Amoco) |  | 0.5 g | 1.0 g |
| 4,4'-N,N-diethylaminobenzophenone | 0.16 g | 0.16 g | 0.16 g |
| benzophenone | 0.2 g | 0.2 g | 0.2 g |
| 3-mercapto-1,2,4-triazole | 0.19 g | 0.19 g | 0.19 g |
| Renolblau B2G-HW ™ (company Hoechst, copper phtalocyanine pigment dispersed in polyvinylbutyral) | 0.12 g | 0.12 g | 0.12 g |
| Leuco-Kristallviollett [tris-(4-diaminophenyl) methane] | 0.1 g | 0.1 g | 0.1 g |
| tetrahydrofuran | 40 g | 40 g | 40 g |
| butanone | 45 g | 45 g | 45 g |
| 1-methoxy-propanol-2 | 15 g | 15 g | 15 g |
| corresponding scanning electron microscopy | — |  | FIG. 22 |

From the batches shown, plates are prepared according to Example 1. The weight of the copying layer is about 2.2 g/m$^2$. Subsequently, a cover layer of 1.7 g/m$^2$ dry layer weight is applied in an analogous manner by coating with a solution having the following composition.

10 g poly(1-vinylimidazole) solution (20 weight %)
82 g water
8 g polyvinylalcohol (Airvol 203, company Airproducts, content of remaining acetyl groups of 12 mol-%).

The drying is carried out at 100° C. for 5 min.

The copying layer is exposed as negative copy under a silver film half-tone step wedge having a density range of 0.15 to 1.95, with the density increments being 0.15, by means of a metal halide lamp (MH-burner, company Sack) with 10 mJ/cm$^2$.

The exposed layer is treated with a solvent solution consisting of 3.4 weight % Rewopol NLS 28™ (REWO)
1.8 weight % 2-phenoxyethanol
1.1 weight % diethanolamine
1.0 weight % Texapon 842™ (Henkel)
0.6 weight % Nekal BX Paste™ (BASF)
0.2 weight % 4-toluolenesulfonic acid
91.9 weight % water for 30 sec. Subsequently, the solvent solution is again spread on the surface with a tampon and then the entire plate is rinsed with water. After this treatment, the exposed parts remain on the plate. For assessing the photosensibility, the plate is inked up while wet with a printing ink. The ink acceptance of all plates is good and the formed microlines are reproduced equally well. In all plates, the step wedge is completely covered (formulation 6A–6C) up to step 4 and partly covered up to step 7.

The formed particles of Example 6C are shown in FIG. 22. The average size of the particles is 2–3 µm.

The Example shows that the in-situ particle formation does not have to be limited to positive working systems; an integration into a negative working photosensitive mixture is possible.

Example 7

The following photosensitive composition of:
23.913 weight % ester of a low-molecular novolak with 1,2-naphthoquinone-diazide-4-sulfonic acid RP-2
58.853 weight % cresol/formaldehyde novolak resin (meta:para=75/25), mw=7000
15.067 weight % polysulfone (Udel P1800, Amoco)
0.514 weight % 2,4-trichloromethyl-6[1(4-methoxy)-napthyl)]1,3,5-triazine
1.364 weight % ethyl violet
0.087 weight % FC 431 (company 3M) non-ionogenic fluoroaliphatic polymeric esters is prepared on the basis of the respective solvent combinations shown in Table 12 as a 10% solution. The solution is filtered by means of a 3 µm filter.

TABLE 12

Figure 23:
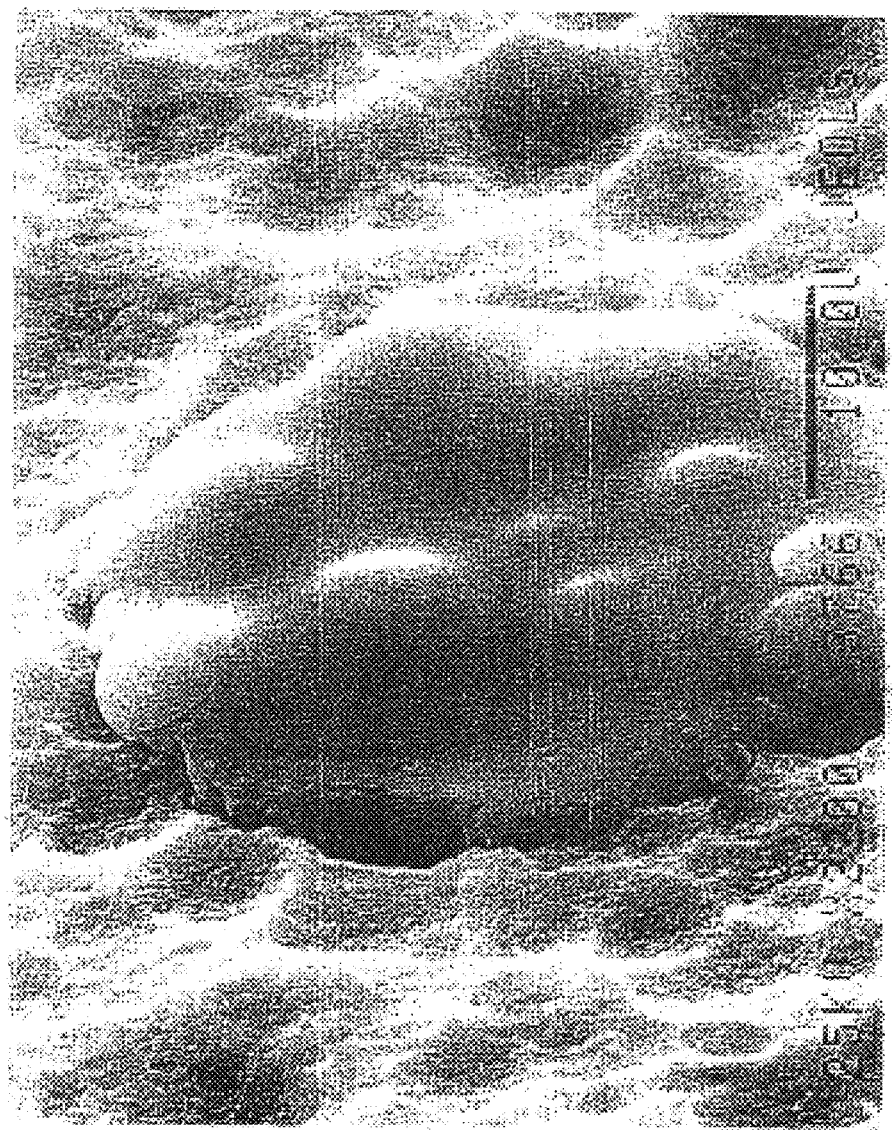
FIG. 23–FIG. 26 shows scanning electron micrographs of printing plates prepared from compositions 7A–7D (Example 7).
Figure 24:
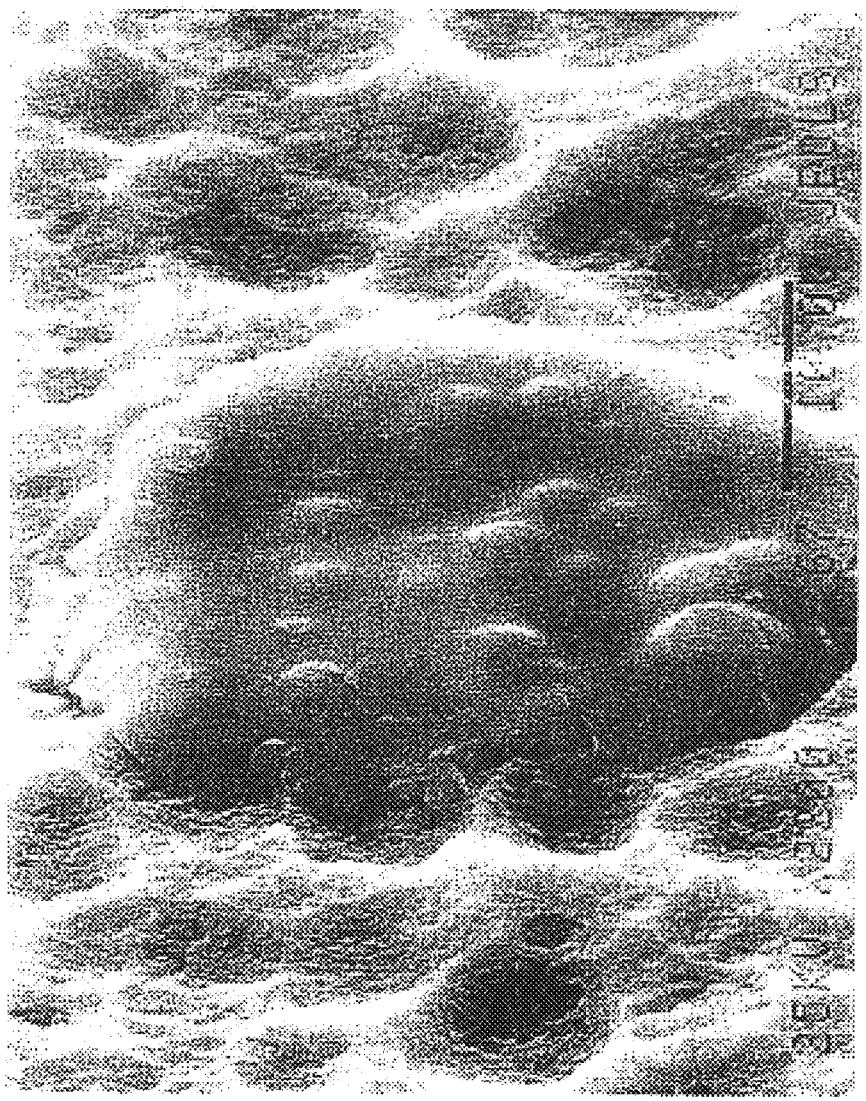
Figure 25:
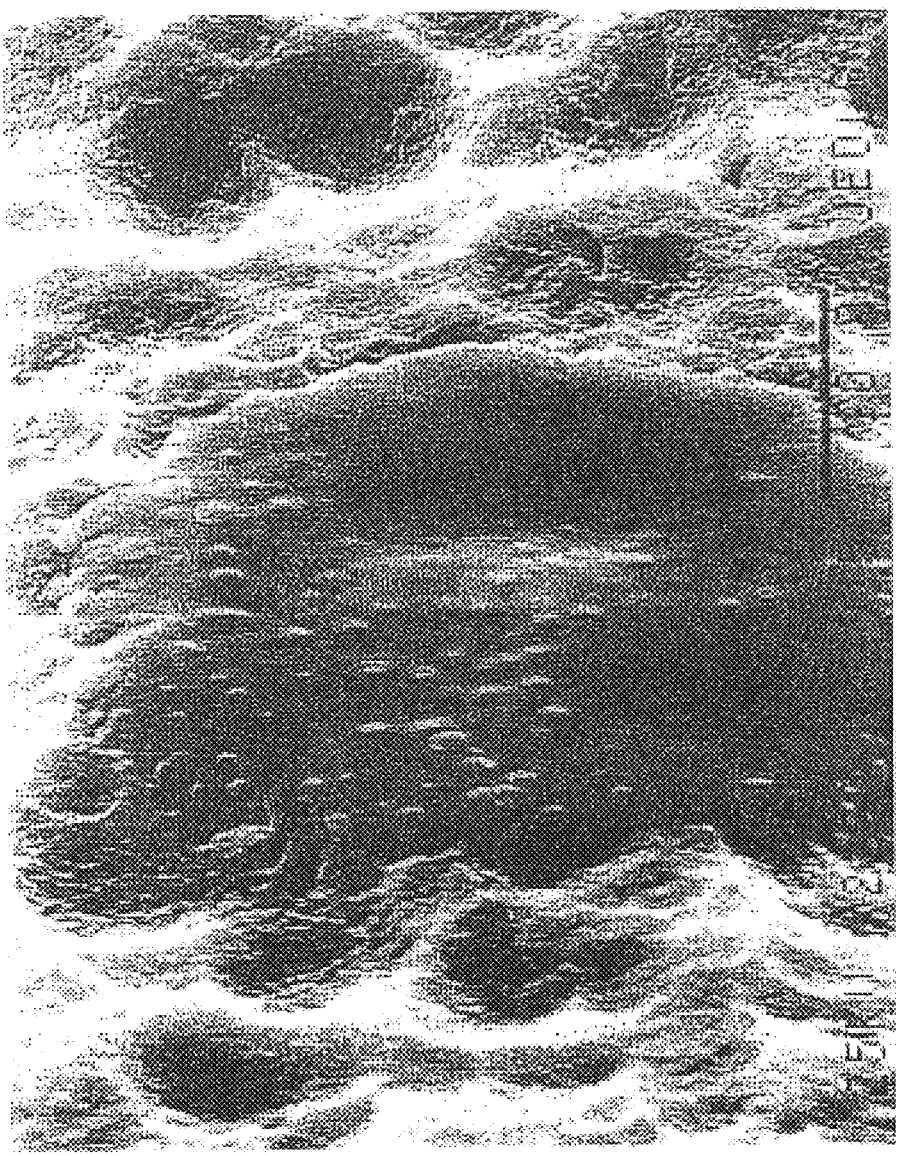
Figure 26:
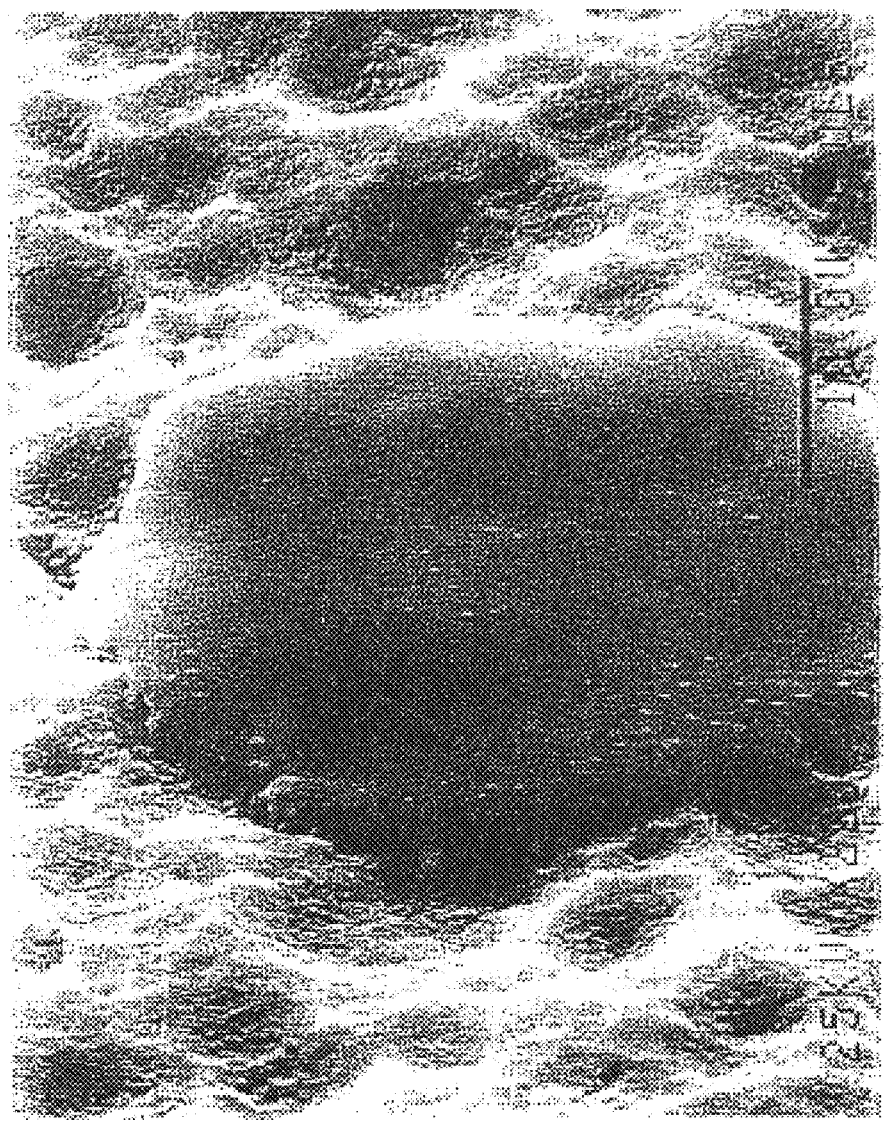

|  | 7A | 7B | 7C | 7D |
|---|---|---|---|---|
| dioxolane [weight-%] | 76.50 | 83.25 | 87.75 | 89.10 |
| methylglykol [weight %] | 13.50 | 6.75 | 2.25 | 0.90 |
| corresponding scanning electron micrograph | FIG. 23 | FIG. 24 | FIG. 25 | FIG. 26 |
| average particle size [µm] | 7 | 4 | 2 | 0.5 |

The coating with the thus obtained solutions is carried out by means of a standard coater; the drying is carried out by means of a drier as shown in FIG. 1. The layer weight is adjusted to 2.4 g/m$^2$. The detention time in the drier is 50 s. The upper and lower air supplies taken together are 1060 m$^3$/h. The temperatures of the individual zones are 75° C. in zone 1, 100° C. in zone 2, 1120C in zone 3 and 98° C. in zone 4 (this corresponds to a standard value on the basis of which also commercial printing plates are prepared). The remaining solvent content after drying is below 2 weight %.

The particles obtained are shown in FIGS. 23–26. Obviously, the particle size can be controlled within a broad range by changing the solvent composition.

From the plates of batches 7A–7C from Table 12, exposed (developed) printing plates according to Example 1 were prepared. The values for the copying parameters are shown in Table 13. The values are all in a similar range.

Furthermore, the plates are subjected to an abrasion test and a test for determining the number of copies according to Example 1 (see Table 13). The print run stability (and the abrasion values) of the plates from batches 7A–C are rather similar. It is to be noted that in spite of the relatively large particles in 7A (and of course also in 7B–D), the microlines both before and after the print run achieved in the printing test have always similar marginal sharpnesses. A "fraying" of the fine line structure by "breaking out" of individual particles does not occur. The plate from 7D does not completely achieve the number of copies of 7A–C which is because the particle size in this case is below the optimum value which is about as high as the layer thickness (~3 μm).

TABLE 13

|  | 7A | 7B | 7C | 7D |
|---|---|---|---|---|
| free grades in the UGRA gray-wedge | 3 | 3 | 3 | 3 |
| μ-lines | 12–15 | 12 | 12 | 10 |
| drop test [s] | <5 | <5 | <5 | <5 |
| soak test [s] | >180 | >180 | >180 | >180 |
| abrasion values [g/m²] | 0.24 | 0.28 | 0.29 | 0.35 |
| number of copies* | 180.000 | 175.000 | 177.000 | 165.000 |

*A comparative plate without the particle-forming polymer only obtains 110.000 copies As the example shows, the in-situ particle formation according to the invention can be carried out without problems in commercially used driers having the usual standard setting. The particle size can be easily controlled by means of the solvent composition. Printing plates with particles being considerably smaller than the layer thickness show a clear loss in print run stability compared to printing plates the particle size of which approximately corresponds to the layer thickness, however, they show a considerable improvement of the print run stability vis-a-vis printing plates without polymer particles according to the invention.

Example 8

From the components shown in Table 14, a solution for a negative working photosensitive composition is prepared.

TABLE 14

Figure 27:
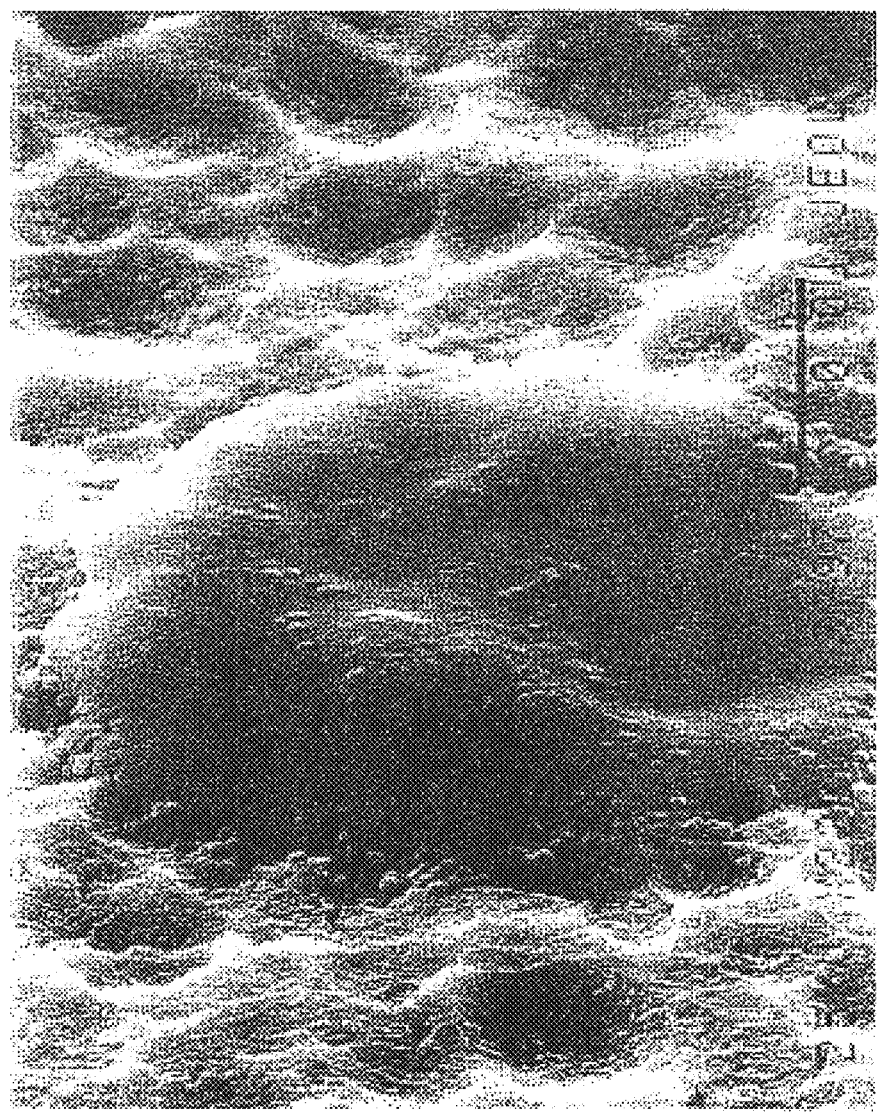
FIG. 27 shows a scanning electron micrograph of a printing plate prepared from composition 8A (Example 8).

| component | 8A | 8B | 8C (comparison) |
|---|---|---|---|
| polymeric binder from patent DE 195.24.851 according to preparation Example 5 | 4.38 | 4.38 | 4.38 |
| polykondensation product from 3-methoxydiphenylamine-4-diazoniumsulfate and 4,4'-bismethoxymethyldiphenylether precipitated from mesitylenesulfate | 4.00 g | 4.00 g | 4.00 g |
| 4-phenylazodiphenylamine | 0.05 g | 0.05 g | 0.05 g |
| phosphoric acid | 0.07 g | 0.07 g | 0.07 g |
| styrene acrylonitrile-copolymer (ASA ™, BASF) grafted on polyacrylate | 1.00 g | 1.00 g |  |
| Renolblau B2G-HW ™ (company Hoechst, copper phthalocyanine pigment dispersed in polyvinylbutyral) | 1.50 g | 1.50 g | 1.50 g |
| methanol | 30 g | 40 g | 30 g |
| butanone | 45 g | 60 g | 45 g |
| methylglycol | 25 g | — | 25 g |
| corresponding scanning electron micrograph | FIG. 27 |  |  |

From the batches shown, plates are prepared according to Example 1. The weight of the photocoating is approximately 2.2 g/m².

The photocoating is exposed as negative copy under a silver film half-tone step wedge (UGRA-wedge filter) having a density range of 0.15 to 1.95, with the density increments being 0.15, by means of a metal halide lamp (MH-burner, company Sack) with 300 mJ/cm².

The development is carried out as in Example 6.

For assessing the photosensibility, the plate is inked up while wet with a printing ink. The ink acceptance of all plates is good and formed microlines are reproduced equally well. In all plates (formulation 8A and 8C) the step wedge is completely covered up to grade 4 and partly covered up to grade 8.

The average particle size of formulation 8A is, as FIG. 27 shows, at about 1 μm. In spite of a different solvent composition, formulation 8B obtains particles having approximately the same size. Formulation 8C does not form particles.

As Example 6, this example shows that the in-situ particle formation does not have to be limited to positive working systems; an integration into a negative working photosensitive mixture is also possible. In particular, it has to be mentioned that in this example, the presence of a low-volatility solvent is not necessary since the chemical incompatibility of high-molecular binder/polymer is sufficient for particle formation.

Example 9

On the basis of the following formulations A–C, plates are prepared as in Example 1.

TABLE 18

| Component | 9A | 9B | 9C (comparative batch) |
|---|---|---|---|
| cresol/formaldehyde novolak resin (meta:para = 75/25), mw = 7000 | 9.05 g | 9.05 g | 9.05 g |
| infrared dye* | 0.75 | 0.75 | 0.75 |
| ethyl violet | 0.20 | 0.20 | 0.20 |
| FC 431 (company 3M) non-ionogenic fluoroaliphatic polymer esters | 0.01 g | 0.01 g | 0.01 g |
| polycarbonate (Makrolon 3108, Bayer) | 1.50 g |  |  |
| acrylbutadienestyrene-terpolymer (Lustran 452, Monsanto) |  | 1.50 g |  |
| dioxan | 77.00 g | 77.00 g | 77.00 g |
| methyl glycol | 13.00 g | 13.00 g | 13.00 g |

*As infrared dyes, the following compositions which absorb above 600 nm and which are described in WO 97/39894 are possible:
2-[3-chloro-5-(1-ethyl-2(1H)-quinolinyliden)-1,3-pentadienyl]-1-ethylquinoliniumbromide
1-ethyl-2-[5-(1-ethyl-2(1H)-quinolinyliden)-1,3-pentadienyl]-quinoliniumiodide
4-[3-chloro-5-(1-ethyl-4(1H)-quinolinyliden)-1,3-pentadienyl]-1-ethylquinoliniumiodide
1-ethyl-4-[5-(1-ethyl-4(1H)-quinolinyliden)-1,3-pentadienyl]-quinoliniumiodide In the plates 9A and B, the particles are well-defined. The particle size is approximately 2 μm.

The samples to be exposed are stamped out in the form of a circle (d=10 cm) and applied to a plate tray which can be controlled from 100–2500 revolutions/min. A laser head having a power of λ=830 nm and 200 mW and a focus of 10 μm is linearly run over the plate tray so that a spiral path is formed. The minimum of energy obtainable is ~150 mJ/cm². The infrared sensitivity of the layers from batches 9A and B is identical with that of the layer from 9C which was prepared according to the same formula—without the developer-insoluble polymer. The laser energies required are ~150 mJ/cm². This follows from the drop tests which take about 5 sec in all three cases.

Regarding the resistance to developers of the unexposed plates, no differences between batches 9A–C can be observed. From about 3 min, a slight attack of the plates begins.

The printing plates 9A–C were subjected to the abrasion test. The results are shown in Table 19.

TABLE 19

| Sample | weight loss [g/m²] (non-baked plate) | weight loss [g/m²] (baked plate) | drop test [s] | soak test [s] |
|---|---|---|---|---|
| 9A | 0.11 | 0.37 | <5 | >120 |
| 9B | 0.37 | 0.54 | <5 | >120 |
| 9C | 1.34 | 0.68 | <5 | >120 |

As the Example shows, it makes no difference for the copying parameters whether the plate contains particles or not.

However, the plates according to the invention containing particles show a clear increase of the mechanical stability. In particular, it has to be emphasized that in this case not only the non-baked but also the baked layer shows a clearly better mechanical stability.

Comparative Example V1

From the components shown in Table 15, a solution for a positive working photosensitive composition was prepared. The batches V1-A and V1-B are based on commercially available and insoluble polymer particles having particle sizes of 3 or 5 μm. In batch V1-C, the particles only form during the in-situ drying step. Batch V1-D is a reference batch without particles or particle-forming polymers. Batches V1-A and V1-B are stirred by means of an Ultra-Turrax™ agitator for 5 min at 20,000 to obtain a better dispersion of the solid particles. Since these two batches are heterogeneous solutions, they cannot be filtered because otherwise the particles would be filtered off. Batches V1-C and V1-D are homogeneous solutions and are filtered.

TABLE 15

| component | V1-A | V1-B | V1-C | V1-D |
|---|---|---|---|---|
| ester of low-molecular novolak with 1,2-naphthoquinone-diazide-4-sulfonic acid | 0.454 g | 0.454 g | 0.454 g | 0.454 g |
| cresol/formaldehyde novolak resin (meta:para = 75/25), mw = 7000 | 3.478 g | 3.478 g | 3.478 g | 3.478 g |
| 2,4-trichloromethyl-6[1(4-methoxy)-naphthyl)]-1,3,5-triazine | 0.030 g | 0.030 g | 0.030 g | 0.030 g |
| ethyl violet | 0.080 g | 0.080 g | 0.080 g | 0.080 g |
| polydimethylsiloxane with 65 weight-% oligomeric ethylene oxide/propylene oxide side groups [40:60], (mw = 20,000) | | | 0.005 g | |
| polysulfone (Udel P1800, Amoco) | | | 0.880 g | |
| microporous polyamide-12-particles with an average diameter of 5 μm | | 0.880 g | | |

TABLE 15-continued

| component | V1-A | V1-B | V1-C | V1-D |
|---|---|---|---|---|
| (Orgasol ™, Elf Atochem) particles from cross-linked methyl groups containing siloxanes having an average diameter of 3 μm (Tospearl ™, Toshiba) | 0.880 g | | | |
| dioxolane | 38.250 g | 38.250 g | 38.250 g | 38.250 g |
| 1-methoxy-propanol-2 | 6.750 g | 6.750 g | 6.750 g | 6.750 g |

From the batches shown, plates according to Example 1 are prepared. The weight of the copying layer is approximately 2.3 g/m².

From the plates, printing plates are prepared as described in Example 4. The number of copies is shown in Table 16. The remaining layer weight (the layer weight of the plate after printing) is also shown in Table 16 and is a quantitative variable for the abrasion of the layer by mechanical forces.

TABLE 16

Figure 28:
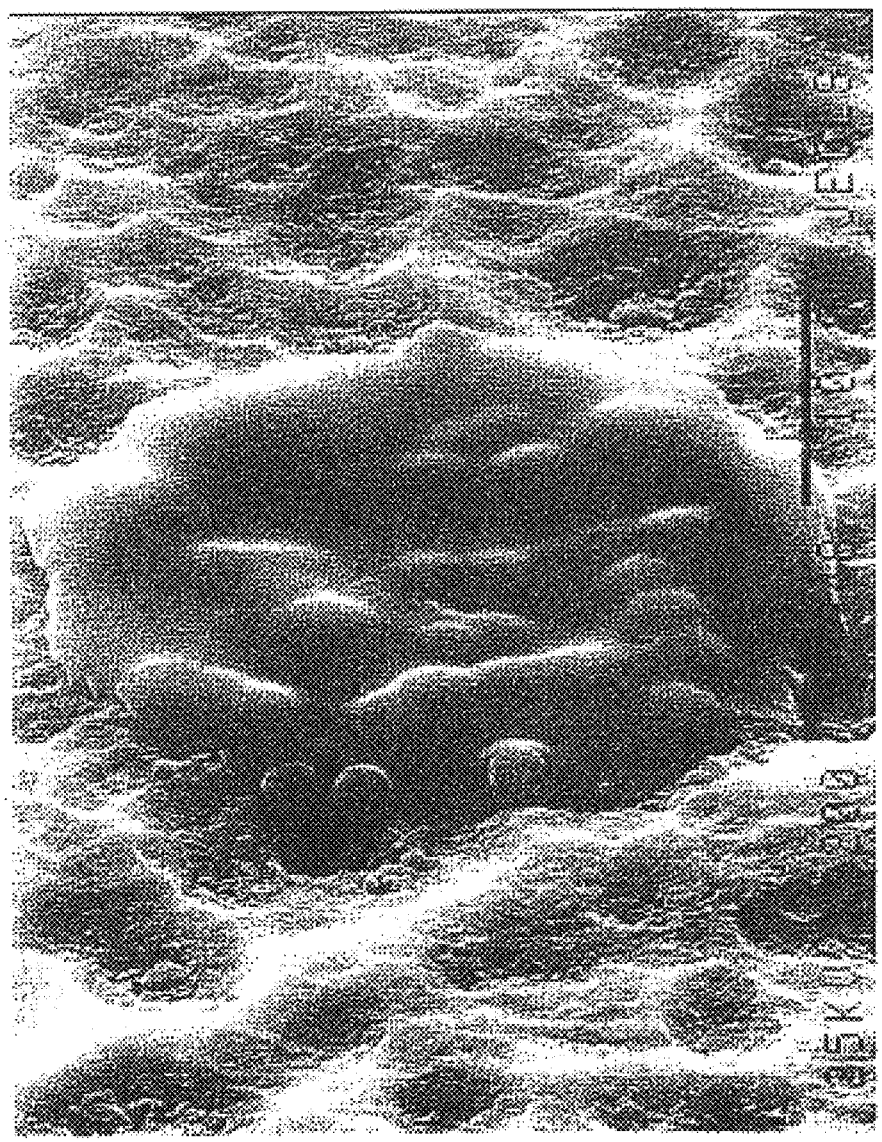
FIG. 28–FIG. 35 show scanning electron micrographs of printing plates (before and after printing) prepared from compositions V1-A-V1-D (Comparative Example 1).
Figure 29:
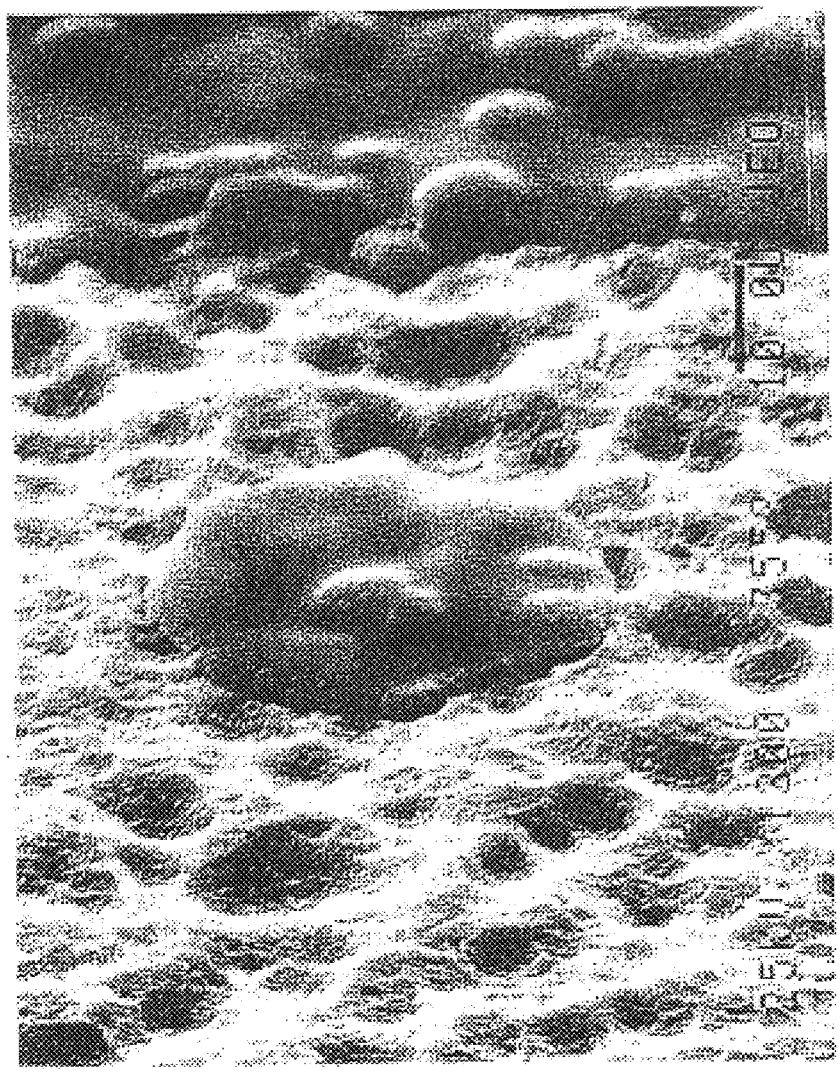
Figure 30:
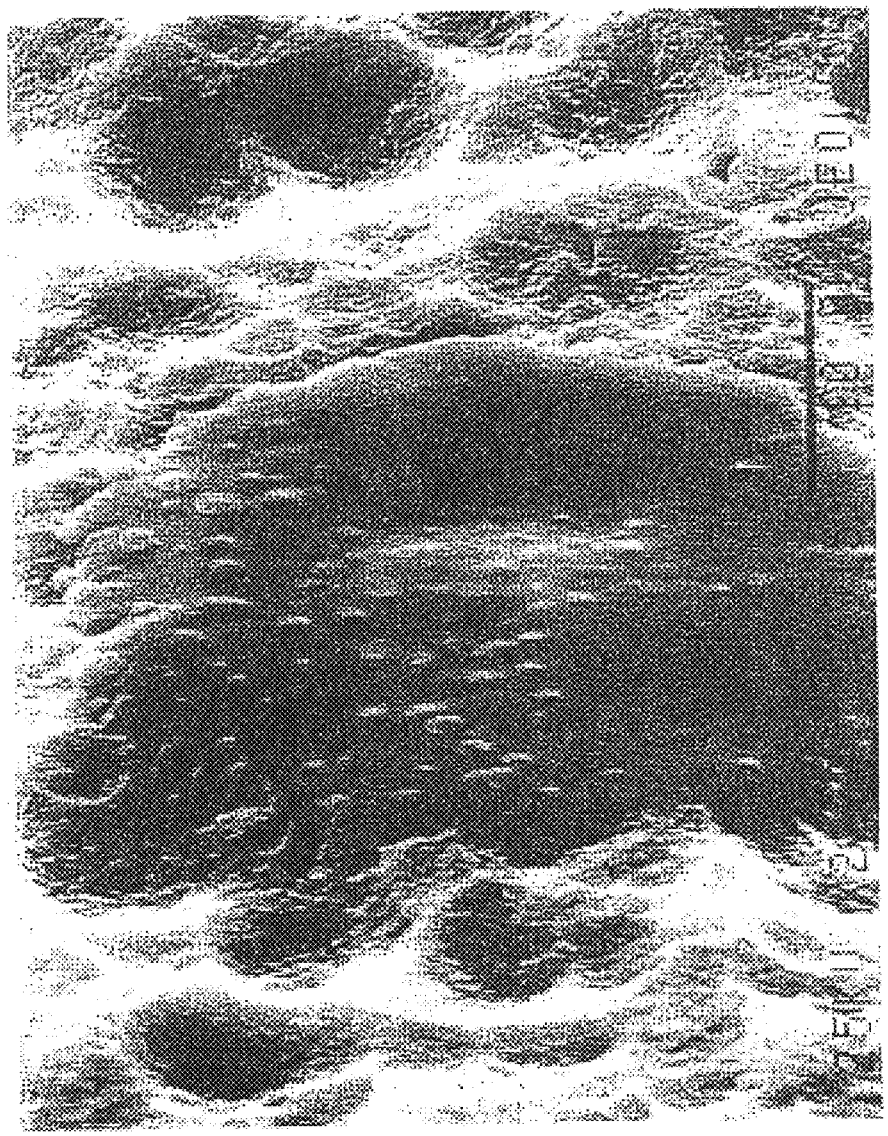
Figure 31:
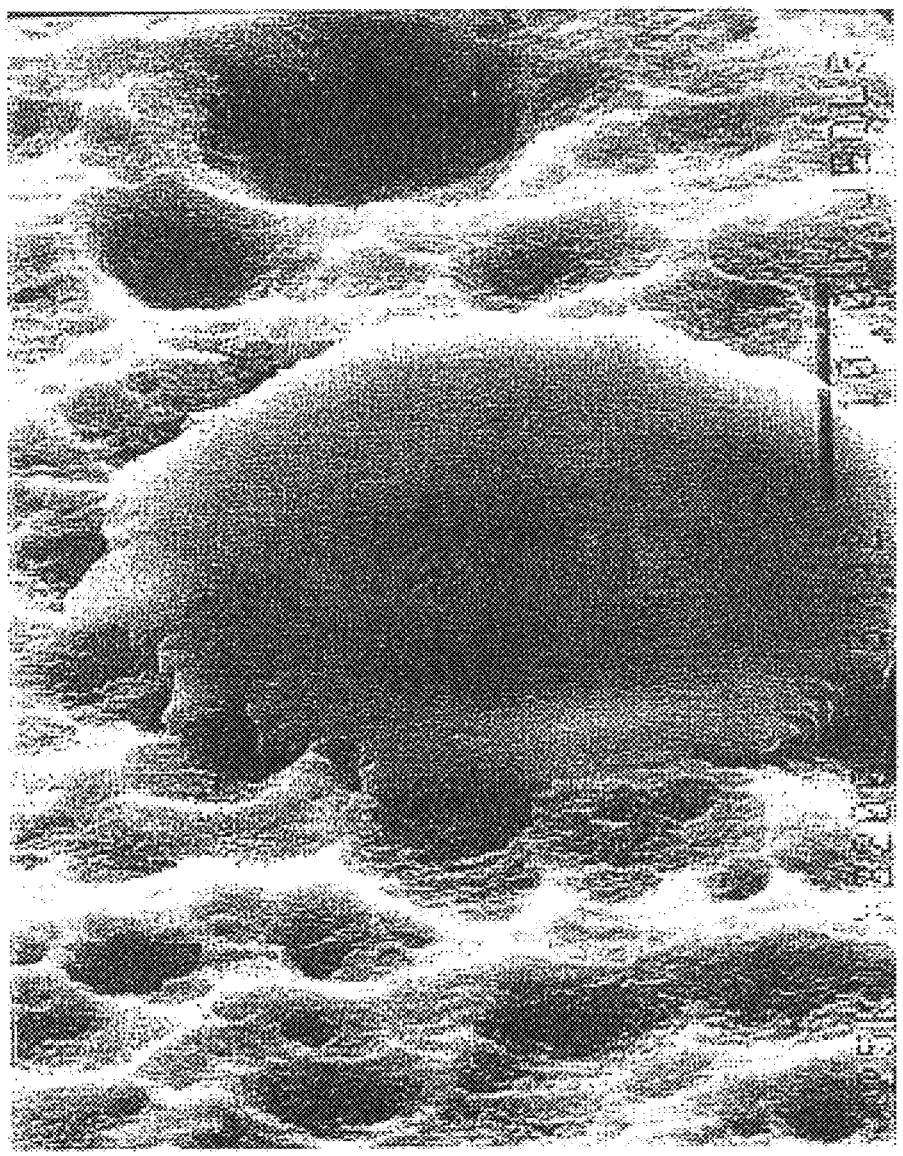
Figure 32:
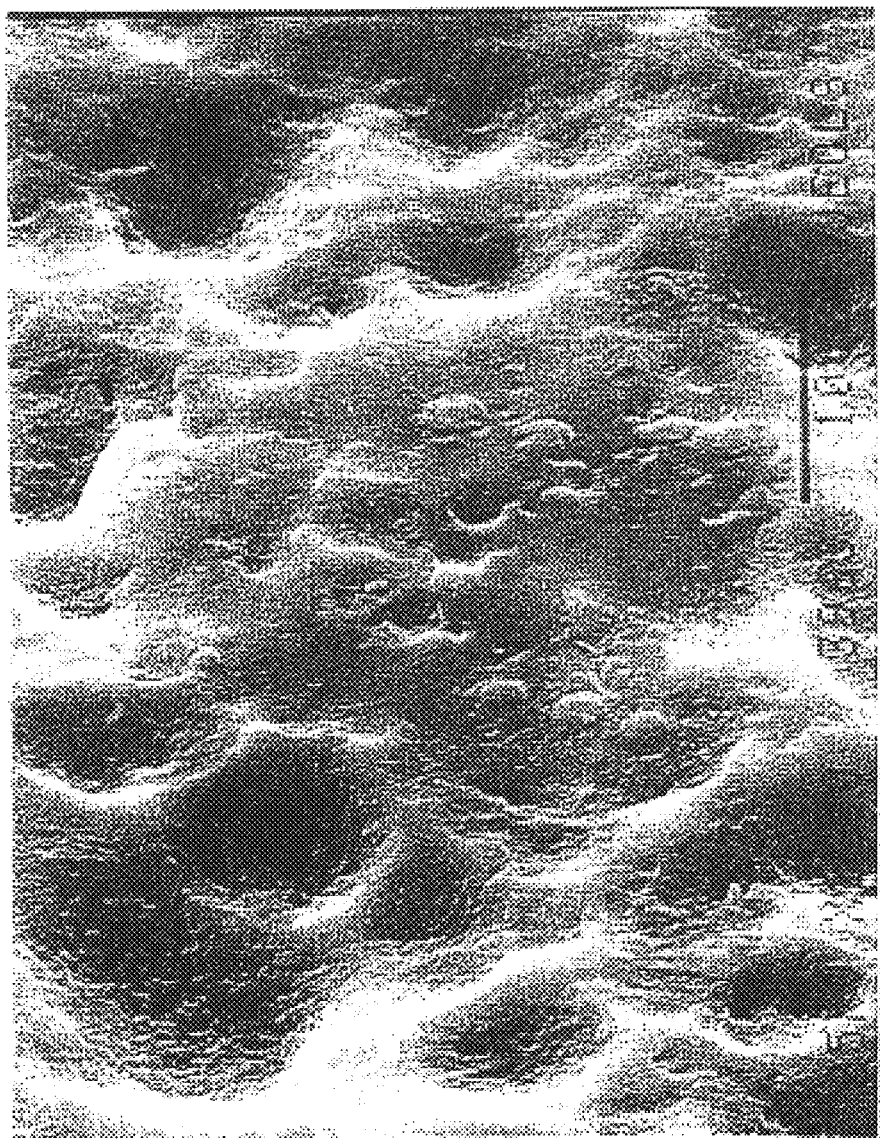
Figure 33:
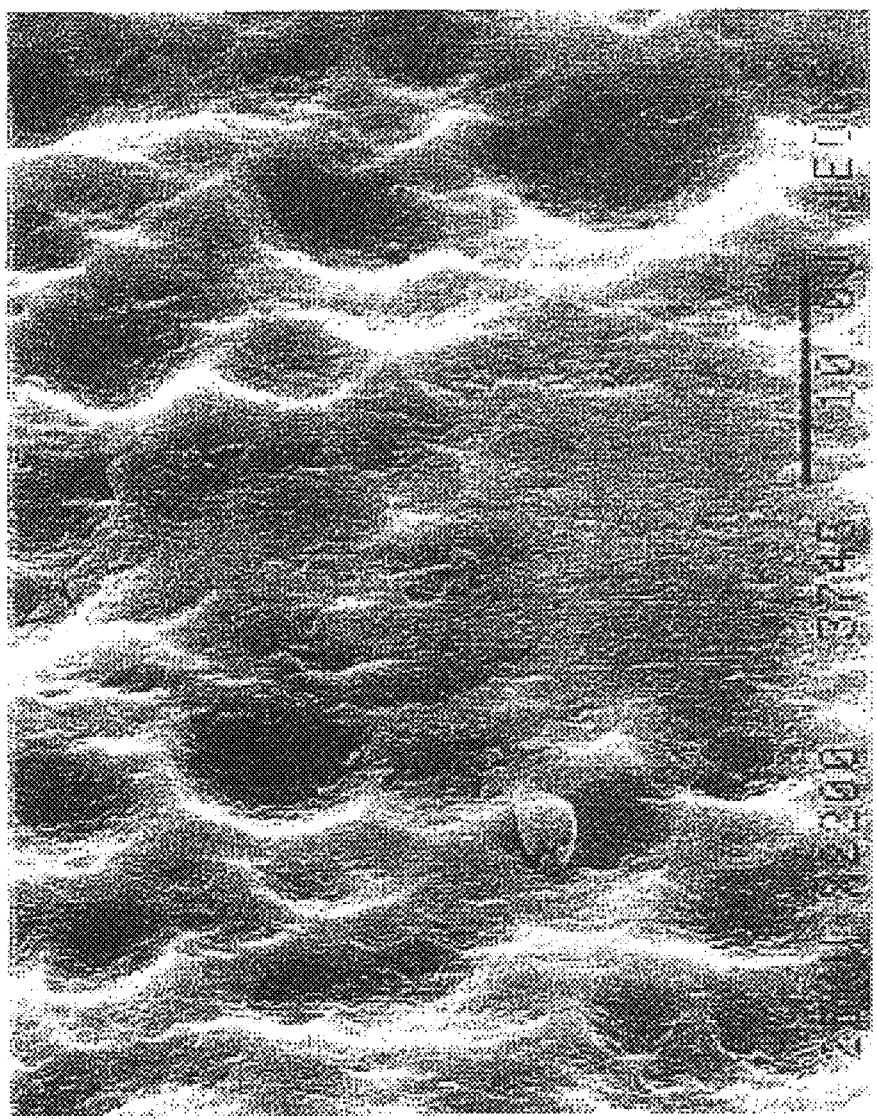
Figure 34:
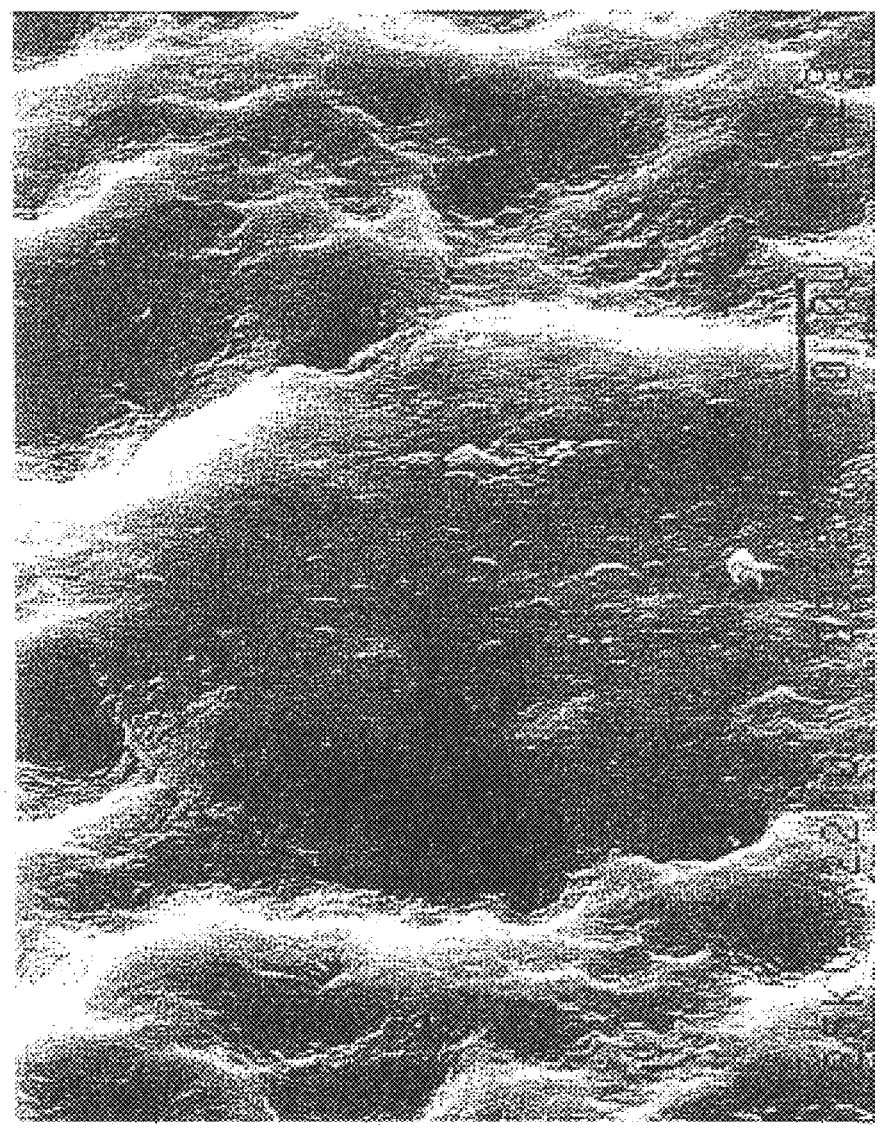
Figure 35:
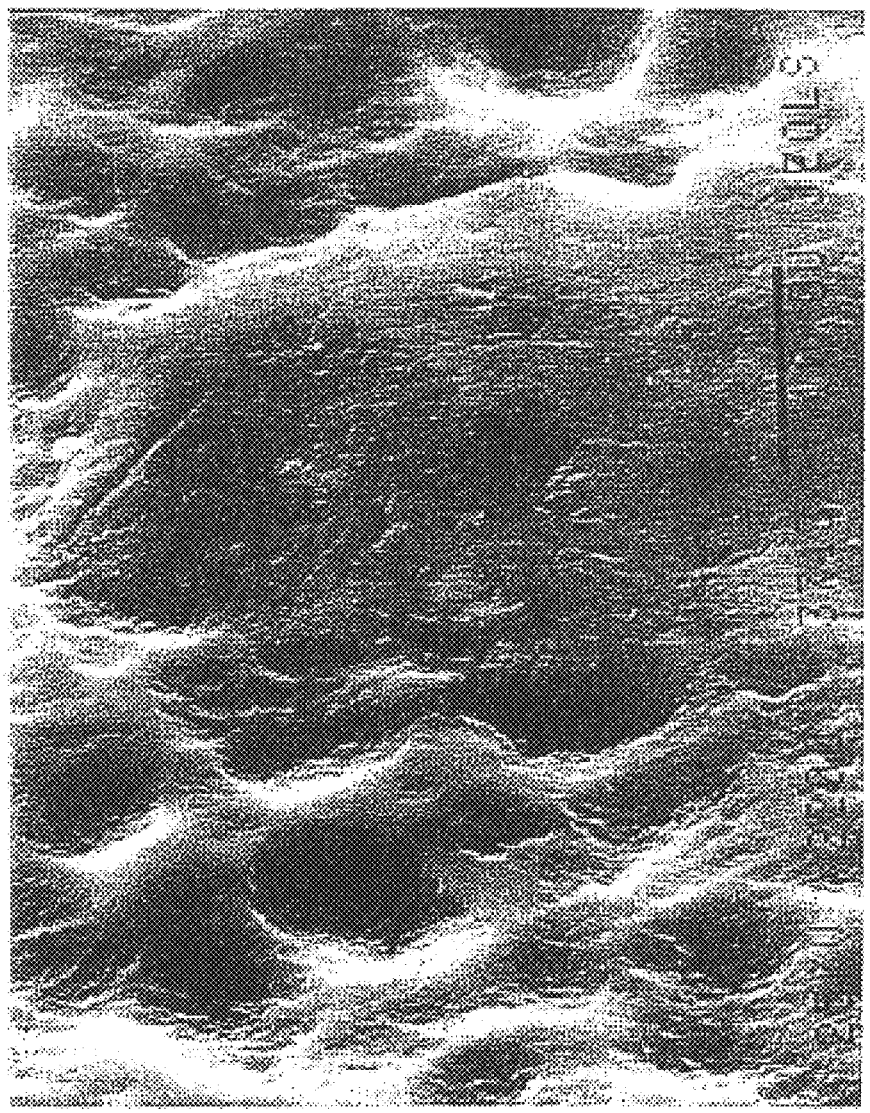

| | V1-A | V1-B | V1-C | V1-D |
|---|---|---|---|---|
| free grades in the UGRA-gray wedge | 3 | 2–3 | 2–3 | 3 |
| drop test [s] | <5 | <5 | <5 | <5 |
| soak test [s] | >180 | >120 | >180 | >180 |
| number of copies | 120.000 | 90.000 | 180.000 | 110.000 |
| remaining layer weight after printing [g/m²] | 1.4 | 0.9 | 1.9 | 1.2 |
| scanning electron micrographs before printing | FIG. 28 | FIG. 29 | FIG. 30 | FIG. 31 |
| scanning electron micrographs after printing | FIG. 32 | FIG. 33 | FIG. 34 | FIG. 35 |

After printing of the plate from batch V1-A (see FIG. 32), small cavities can be observed in the center of the image area. These cavities have formed because the particles were torn out of the matrix surrounding them. This is also a reason for the low number of copies of these plates compared to a plate from batch V1-C.

As the Example shows, the print run stability of the plates with commercially available particles (from batch V1-A and V1-B) is approximately the same as that of the plate without particles while the plate with particles formed in-situ (batches V1-C) obtains a clearly higher print run stability.

Comparative Example V2

In this comparative example (according to EP-A-0 766 140), a polymer is contained which forms alkali or developer-soluble particles during the drying step.

TABLE 17

| Component | V2-A |
|---|---|
| ester from naphthoquinone-1,2-diazido-5-sulfonic acid chloride and 2,4-dihydroxy-benzophenone | 0.454 g |
| polyurethane from 1,6-diisocyanatohexane and 3,5-diamino benzoic acid (molar ratio: 1:1) | 1.005 g |

TABLE 17-continued

| Component | V2-A |
|---|---|
| polymer from 10% by weight methacrylic acid, 20% by weight N-phenylmaleimide and 70% by weight methacrylamide | 1.000 g |
| cresol/formaldehyde novolak resin (meta:para = 75/25), mw = 7000 | 2.100 g |
| 2,4-trichloromethyl-6[1(4-methoxy)-napthyl)]1,3,5-triazine | 0.030 g |
| ethyl violet | 0.065 g |
| polydimethylsiloxane with 65% by weight oligomeric ethylene oxide/propylene-oxide side groups [40:60], (mw = 20.000) | 0.008 g |
| dioxolane | 25 g |
| dimethylformamide | 20 g |
| free grades in the UGRA-gray wedge | 2 g |
| drop test [s] | <10 g |
| soak test [s] | >120 g |

According to Example 1, plates are prepared, exposed and developed from the formulation. The scanning electron micrograph of such a plate treated with developer is shown in FIG. 36.

Figure 36:
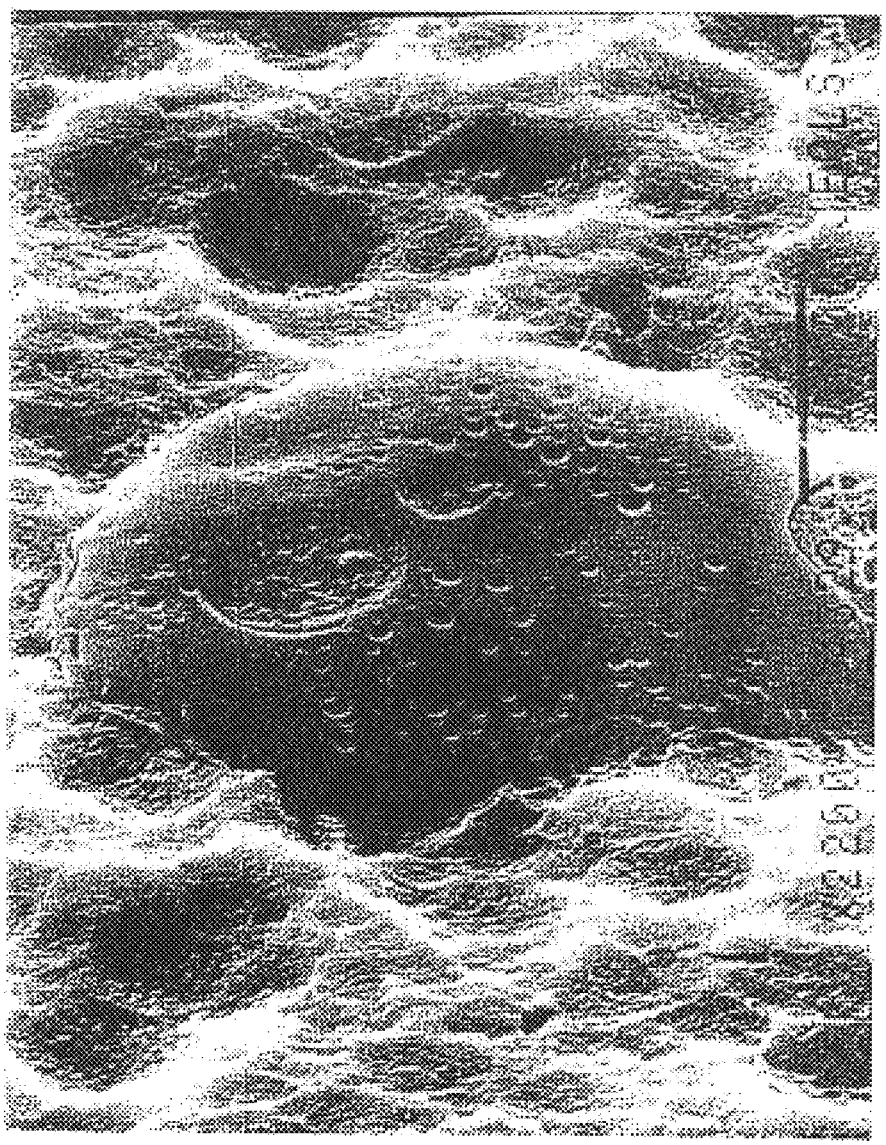
FIG. 36 shows scanning electron micrographs of printing plates prepared from compositions V2-A (Comparative Example 2).

As FIG. 36 shows, the particles that are on the surface are dissolved out of the matrix surrounding them during the development due to the developer-solubility.

Small cavities remain which rather have a destabilizing influence on the layer regarding the mechanical stability.

What is claimed is:

1. Coating solution for the preparation of a printing plate, comprising:
   a) a positive or negative working, or electrophotographically working photosensitive composition,
   b) a thermoplastic polymer which is soluble in organic media but insoluble in alkaline media,
   c) a solvent component A which dissolves both the photosensitive composition and the thermoplastic polymer, and optionally
   d) a solvent component B which dissolves the photosensitive composition but not the thermoplastic polymer and which is less volatile than component A,
   with a) and b) being homogeneously dissolved in the mixture of c) and d).

2. Coating solution according to claim 1 wherein the alkali-insoluble thermoplastic polymer soluble in organic media is at least one selected from polystyrene, styrene acrylonitrile copolymer, polycarbonate, polymethylmethacrylate, polyvinylchloride, polymethylpentene, acrylonitrile-butadiene-styrene terpolymer and polysulfone.

3. Coating solution according to claim 1 wherein a tenside is additionally contained.

4. Process for the preparation of a printing plate, comprising
   a) providing an optionally pre-treated substrate,
   b) applying a coating solution as defined in claim 1,
   c) drying and
   d) optionally baking.

5. Process according to claim 4 wherein the substrate is an aluminum plate.

6. Printing plate obtainable by a process according to claim 4.

7. Printing plate according to claim 6 wherein the photosensitive layer applied contains particles from the thermoplastic polymer B.

8. Printing plate according to claim 7, wherein the particles have an average diameter of 0,5–15 µm.

9. Printing plate according to claim 7 wherein the particle diameter corresponds to the layer thickness of the photosensitive layer.

* * * * *

UNITED STATES PATENT AND TRADEMARK OFFICE
CERTIFICATE OF CORRECTION

PATENT NO. : 6,238,831 B1
DATED : May 29, 2001
INVENTOR(S) : Hauck et al.

It is certified that error appears in the above-identified patent and that said Letters Patent is hereby corrected as shown below:

Column 3,
Line 30, "blockpolymers" should read -- block-polymers --
Line 32, "blockpolymers" should read -- block-polymers --
Line 33, "blockpolymers" should read -- block-polymers --
Line 40, "polyacetale," should read -- polyacetals, --

Column 4,
Line 20, "tetrahydrofurane" should read -- tetrahydrofuran --
Line 21, "dioxan" should read -- dioxane --
Line 29, "methyidiglycol" should read -- methyldiglycol --

Column 6,
Table 1, "acrylonitril-" should read -- acrylonitrile- --

Column 7,
Line 11, "photosensibility" should read -- photosensitivity --
Line 15, "photosensibilities" should read -- photosensitivities --
Line 25, "pipet." should read -- pipette. --
Line 34, "pipefte." should read -- pipette. --

Column 8,
Table 3, "novolak" should read -- novolac --; and "napthyl" should read -- naphthyl --

Column 9,
Table 3, "acrylonitril-" should read -- acrylonitrile- --
Table 4, "0,5" should read -- 0.5 --, and "3,5" should read -- 3.5 --
Table 5, "novolak" should read -- novolac --, and "und" shluld read -- and --

Column 11,
Table 7, "molecuar" should read -- molecular --, "novolak" (both occurences) should read -- novolac --, "diazid" should read -- diazide --, "napthyl" should read -- naphthyl --, "blockpolymer" should read -- block polymer --, "dioxan" should read -- dioxane -- "styreneacrylonitn" should read -- styreneacrylonitrile- --, and "poiystyrene" should read -- polystyrene --

UNITED STATES PATENT AND TRADEMARK OFFICE
CERTIFICATE OF CORRECTION

PATENT NO. : 6,238,831 B1
DATED : May 29, 2001
INVENTOR(S) : Hauck et al.

It is certified that error appears in the above-identified patent and that said Letters Patent is hereby corrected as shown below:

Column 13,
Table 8, column 3, row 2, "0.36" should read -- 0.30 --

Column 14,
Table 9, "novolak" should read -- novolac --, "napthyl" should read -- naphthyl --, and "styreneacrylonitril-" should read -- styreneacrylonitrile- --
"2,4-trichioromethyl" should read -- 2,4-trichloromethyl --

Column 15,
Line 15, "novolak" should read -- novolac --
Table 11, "phtalocyanine" should read -- phthalocyanine --

Column 16,
Line 6, "toluolenesulfonic" should read -- toluenesulfonic --
Line 12, "photosensibility" should read -- photosensitivity --
Line 27, "novolak" should read -- novolac --
Line 29, "novolak" should read -- novolac --
Line 33, "napthyl" should read -- naphthyl --
Table 12, "methylglykol" should read -- methylglycol --
Line 57, "1120C" should read -- 112µ C --

Column 17,
Table 14, "polykondensation" should read -- polycondensation --

Column 18,
Line 7, "photosensibility" should read -- photosensitivity --
Table 18, "novolak" should read -- novolac --, and "dioxan" should read -- dioxane --,
Table 18 (fn), "quinolinyliden" (four occurrences) should read -- quinolinylidene --

Column 20,
Table 15, "novolak" (both occurrences) should read -- novolac --

Column 21,
Table 17, "novolak" should read -- novolac --, and "napthyl" should read -- naphthyl --

UNITED STATES PATENT AND TRADEMARK OFFICE
CERTIFICATE OF CORRECTION

PATENT NO. : 6,238,831 B1
DATED : May 29, 2001
INVENTOR(S) : Hauck et al.

It is certified that error appears in the above-identified patent and that said Letters Patent is hereby corrected as shown below:

Column 22,
Line 32, "0,5-15µm" should read -- 0.5-15µm --

Signed and Sealed this

Twenty-third Day of April, 2002

*Attest:*

*Attesting Officer*

JAMES E. ROGAN
*Director of the United States Patent and Trademark Office*